United States Patent [19]
Iketani et al.

[11] Patent Number: 5,824,426
[45] Date of Patent: Oct. 20, 1998

[54] MAGNETO-OPTICAL RECORDING MEDIUM

[75] Inventors: Naoyasu Iketani, Tenri; Yoshiteru Murakami, Nishinomiya; Akira Takahashi, Nara; Kenji Ohta, Kitakatsuragi-gun, all of Japan

[73] Assignee: Sharp Kabushiki kaisga, Osaka, Japan

[21] Appl. No.: 535,967

[22] Filed: Sep. 28, 1995

[30] Foreign Application Priority Data

Oct. 14, 1994 [JP] Japan .................................... 6-249795

[51] Int. Cl.⁶ .......................... G11B 5/716; G11B 11/00; G11B 5/66
[52] U.S. Cl. ........................ 428/694 ML; 428/694 RE; 428/694 MM; 428/694 GR; 369/13; 369/288
[58] Field of Search ............................ 369/13, 272, 283, 369/286, 288; 428/694 ML, 694 MT, 694 RE, 694 GR, 694 MM, 694 EC, 694 SC, 64.2, 64.3

[56] References Cited

U.S. PATENT DOCUMENTS

| | | | |
|---|---|---|---|
| 5,053,287 | 10/1991 | Mizumoto et al. | 428/694 |
| 5,094,925 | 3/1992 | Ise et al. | 428/694 |
| 5,248,565 | 9/1993 | Tsutsumi et al. | 428/694 EC |
| 5,357,494 | 10/1994 | Aratani | 369/13 |
| 5,428,585 | 6/1995 | Hirakane et al. | 369/13 |
| 5,436,072 | 7/1995 | Hatwar et al. | 478/336 |
| 5,450,382 | 9/1995 | Shiratori et al. | 369/13 |
| 5,452,272 | 9/1995 | Murakami et al. | 369/13 |
| 5,486,395 | 1/1996 | Murakami et al. | 428/64.3 |

FOREIGN PATENT DOCUMENTS

| | | |
|---|---|---|
| 0596716 | 5/1994 | European Pat. Off. . |
| 54-121719 | 9/1979 | Japan . |
| 63-282945 | 11/1988 | Japan . |
| 5-325283 | 12/1993 | Japan . |

OTHER PUBLICATIONS

Y.J. Choe et al., *Journal of Japan Applied Magnetics*, "Magneto–Optical kerr Effects of Nd–(Fe, Co) Thin Films", 12:2, pp. 207–210 (1988) (No Month).

M. Ishida et al., *Abstracts of 17th Lecture Meeting Held by Japan Applied Magnetics*, "Effect of Nd Content On Short–Wavelength Magneto–Optical Disk", p. 54 (1993) (No Month).

*Primary Examiner*—John J. Zimmerman
*Assistant Examiner*—Michael LaVilla
*Attorney, Agent, or Firm*—David G. Conlin; Linda M. Buckley

[57] ABSTRACT

A magneto-optical recording medium includes a readout layer having in-plane magnetization at room temperature and in which a transition occurs from in-plane magnetization to a perpendicular magnetization when temperature rises, and a recording layer for storing information thereon magneto-optically. In the readout layer made of GdFeCo by adding Nd thereto, an amount of Nd to be added changes in a direction perpendicular to its film surface, and an amount of Nd is larger on a light incidence side than on the other side. As a result, even when a laser with a short wavelength is used, high density recording can be achieved as undesirable recording and reproducing operations due to a change in a magnetic interaction is prevented and also deterioration in quality of a reproducing signal is prevented.

20 Claims, 18 Drawing Sheets

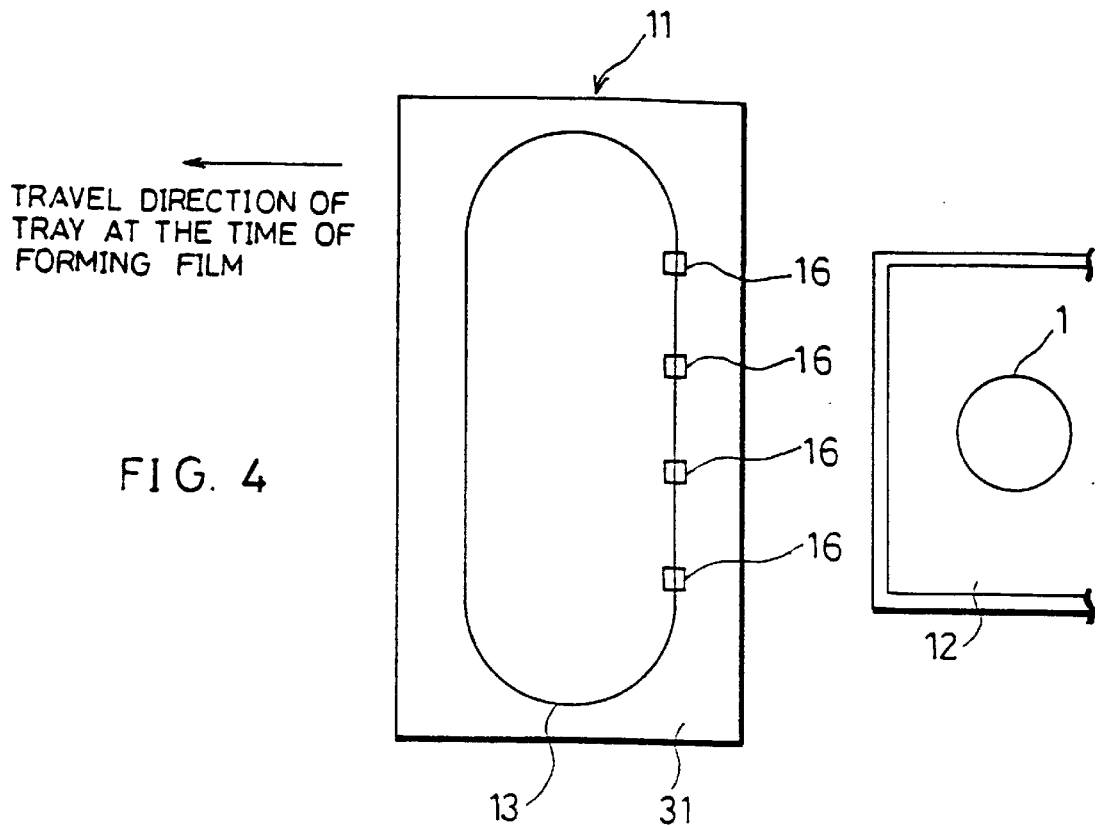
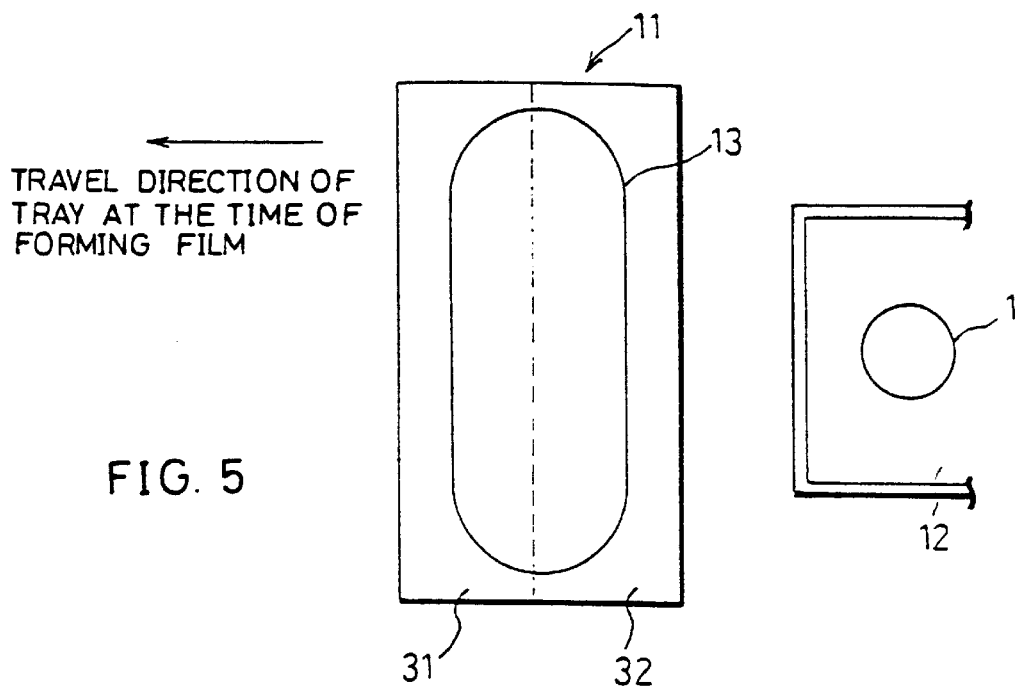

THRESHOLD TEMPERATURE : TEMPERATURE WHEN TRANSITION OCCURS FROM IN-PLANE MAGNETIZATION TO PERPENDICULAR MAGNETIZATION

MAGNETO-OPTICAL RECORDING MEDIUM

FIELD OF THE INVENTION

The present invention relates to a magneto-optical recording medium such as a magneto-optical disk, a magneto-optical tape, a magneto-optical card for use in a magneto-optical recording device, and also relates to a producing method thereof.

BACKGROUND OF THE INVENTION

Research and development on magneto-optical recording media such as magneto-optical disks have been carried out as being a rewritable optical disk, and some of the magneto-optical recording media have been already practically used as external memory designed for computers. Since such a magneto-optical disk adopts a perpendicular magnetization film as a recording medium and recording and reproducing are carried out by using a light, it has a larger capacity compared to a floppy disk or a hard disk adopting an in-plane magnetization film.

In recent years, since recording with higher density is required, a high density magneto-optical recording medium composed of a magnetic layer having a multi-layered structure, which is capable of reproducing a recording bit fairly smaller than a size of a light spot with magnetic super resolution, namely, is capable of reproducing with high resolution, is proposed.

For example, Japanese Unexamined Patent Publication 5-81717/1993 (Tokukaihei 5-81717) discloses a magneto-optical recording medium which is provided with a recording layer for recording information magneto-optically and a readout layer in which in-plane magnetization appears at room temperature and a transition occurs from in-plane magnetization to a perpendicular magnetization when a temperature is risen.

In such a magneto-optical recording medium, reasons that reproducing with high resolution is possible will be explained referring to FIGS. 21 through 23. Here, the case of a magneto-optical disk will be taken.

As shown in FIG. 21, the magneto-optical disk has a basic arrangement that a substrate 201, a transparent dielectric layer 202, a readout layer 203, a recording layer 204, a protective layer 205 and an overcoat layer 206 are laminated in this order.

FIG. 22 shows a magnetic phase diagram of rare-earth transition metal alloy used in the readout layer 203. In the drawing, a horizontal axis indicates a content of rare earth metal (ratio) (RE), and a vertical axis indicates temperature. A composition range where the rare earth metal alloy has perpendicular magnetization (indicated by A in the drawing) is extremely narrow. This is because perpendicular magnetization appears only in the vicinity of a compensating composition (indicated by P in the drawing) where a magnetic moment of the rare earth metal and a magnetic moment of transition metal balance with each other.

The respective magnetic moments of the rare earth metal and the transition metal have different temperature dependencies. Specifically, the magnetic moment of the transition metal becomes greater than that of the rare earth metal at high temperature. For this reason, the content of the rare earth metal is set greater than that in the compensating composition at room temperature so that the alloy does not have perpendicular magnetization but has in-plane magnetization at room temperature. When a light beam is projected, as a temperature of the portion illuminated with the light beam is raised, the magnetic moment of the transition metal becomes relatively greater until it balances with that of the rare earth metal, thereby having perpendicular magnetization.

FIGS. 23($a$) through 23($d$) show one example of hysteresis characteristics of the readout layer 203. In each drawing, a horizontal axis indicates an external magnetic field (Hex) to be applied perpendicularly to a surface of the readout layer 203, and a vertical axis indicates a polar Kerr rotation angle ($\theta$k) in the case where a light is allowed to perpendicularly enter the surface of the readout layer 203. FIG. 23($a$) shows hysteresis characteristics of the composition P shown in the magnetic phase diagram in FIG. 22 of the readout layer 203 in a temperature range of room temperature to temperature $T_1$, and FIGS. 23($b$) through 23($d$) respectively show hysteresis characteristics in temperature ranges of $T_1$ to $T_2$, $T_2$ to $T_3$ and $T_3$ to Curie temperature (Tc).

In the temperature range of $T_1$ to $T_3$, the readout layer 203 shows such a hysteresis characteristic that an abruptly rising of polar Kerr rotation angle appears with respect to the external magnetic field. In other temperature ranges, however, the polar Kerr rotation angle is substantially zero.

When the rare earth transition metal having the above-mentioned characteristics is applied to the readout layer, the magneto-optical disk is provided with higher recording density. Namely, a recording bit with a size smaller than a size of a light spot can be reproduced. The reasons for this will be described below.

As shown in FIG. 21, when reproducing, a reproducing light beam 207 is projected as a light spot 209 to the readout layer 203 through a converging lens 208 from a side of the substrate 201. Here, information is recorded on the recording layer 204 in the magnetization direction shown in the drawing, for example. In a portion of the readout layer 203 where the light spot 209 has been projected, its center portion is heated to higher temperature than a peripheral portion. More specifically, since the reproducing light beam 207 is converged to a diffraction limit by the converging lens 208, a light intensity distribution of the light spot 209 shows a Gaussian distribution, and thus a temperature distribution of the portion of the magneto-optical disk which is reproduced also shows like a Gaussian distribution. Here, the light beam 207 is projected to the readout layer 203 such that the temperature of the central portion of the irradiated area in the readout layer 203 is raised above $T_1$ in FIG. 22 and the temperature of the peripheral portion is not raised above $T_1$. Since only the portion having a temperature of not less than Ti is subject to reproduction, a recording bit with a size smaller than a diameter of the light spot 209 can be reproduced, thereby remarkably improving the recording density.

In other words, a transition occurs in the portion having the temperature of not less than $T_1$ from in-plane magnetization to perpendicular magnetization (from the state shown in FIG. 23($a$) to FIG. 23($b$) or the state shown in FIG. 23($c$)). At this time, a direction of the magnetization of the recording layer 204 is transferred to the readout layer 203 by exchange coupling force between the readout layer 203 and the recording layer 204. Meanwhile, in the peripheral portion other than the central portion where the light spot 209 has been projected, since the temperature is not more than $T_1$, the in-plane magnetization (FIG. 23($a$)) is maintained. As a result, with respect to the light beam 207 irradiated in a direction perpendicular to the film surface, the polar Kerr rotation effect is not shown.

As described, when a transition occurs in the portion where the temperature is risen from in-plane magnetization to perpendicular magnetization, the pole Kerr rotation effect is shown only in the central portion where the light sport 209 has been projected, and only information recorded on the recording layer 204 corresponding to the above portion is reproduced based upon a reflected light from the portion.

Thereafter, when the light spot 209 shifts (the magneto-optical disk rotates) so that the next recording bit is reproduced, the temperature drops below $T_1$ in the portion which has been previously subject to reproduction, and a transition occurs from perpendicular magnetization to in-plane magnetization. Accordingly, the polar Kerr rotation effect is no longer shown in the portion where the temperature drops. Therefore, information in the portion where the temperature drops is no longer reproduced and thus interference by signals from the adjoining bits, which causes noise, is eliminated.

As mentioned above, when the above magneto-optical disk is used, a recording bit with a size smaller than the diameter of the light spot can be securely reproduced without being affected by the adjoining recording bits, so the recording density can be remarkably improved.

As to the embodiment of the high density magneto-optical recording disk, the inventors of the invention disclose the properties and effects in the Proceedings of Magneto-Optical Recording International Symposium 1992, J. Magn. Soc. Jpn., Vol. 17, Supplement No. S1 (1993), pp. 201–204, "Super Resolution Readout of a Magneto-Optical Disk with an In-plane Magnetization Layer".

In the publication, in the magneto-optical recording medium having the arrangement shown in FIG. 21, GdFeCo is used as the readout layer 203 and DyFeCo as the recording layer 204. In the GdFeCo, its composition range that perpendicular magnetization (shown by A in FIG. 22) is extremely narrow and a transition suddenly occurs from in-plane magnetization to perpendicular magnetization with respect to the temperature. Therefore, the GdFeCo is a suitable material for the high density recording medium. FIG. 24 shows a temperature dependency of the polar Kerr rotation angle measured from the readout layer of the recording medium. A threshold temperature at which a transition occurs from in-plane magnetization to perpendicular magnetization is around 100° C. At temperature not more than 100° C., since in-plane magnetization is shown, the polar Kerr rotation angle is extremely small. Meanwhile, since a transition suddenly occurs from in-plane magnetization to perpendicular magnetization in the vicinity of 100° C., the polar Kerr rotation angle suddenly increases.

The threshold temperature is a very important factor which determines the reproducing laser power at the time of reproducing signals by the laser beam. FIG. 25 shows a relationship between the reproducing laser power and an amplitude of the reproducing signal in the magneto-optical recording medium. The amplitude of the signal suddenly increases with an increase in the reproducing laser power, and is maximized at about 2 mW to 2.3 mW.

From the above-mentioned principle of reproduction, a signal can be obtained only after the area having a temperature above 100° C. appears in the reproducing light spot. Moreover, in the case where the threshold temperature is 100° C., a suitable reproducing power is 2 mW to 2.3 mW.

In the case where the threshold temperature is higher than 100° C., more reproducing power is required. If the threshold temperature is set too high, unwanted recording may occur by the reproducing power, and information recorded on the recording layer may be destroyed. On the contrary, when the threshold temperature is set lower than 100° C., a lesser reproducing power is required. However, if the threshold temperature is set too low, to about 40° C., for example, the temperature of the whole spot becomes not less than 40° C. in the case where a circumferential temperature at the time of reproduction is 40° C., thereby making it impossible to reproduce information with high resolution.

As mentioned above, in the high density magneto-optical recording medium, it is very important to control the threshold temperature at which a transition occurs from in-plane magnetization to perpendicular magnetization.

In addition, at the time of reproduction, in an area having a temperature above the threshold temperature, the magnetization direction of the recording layer (in a direction perpendicular to the film surface, upward or downward) should be securely transferred to the readout layer. In other words, the portion where the magnetization direction of the readout layer is perpendicular should follow the magnetization direction of the recording layer (upward or downward).

The above conditions can be achieved by controlling each composition of the layers considering the magnetic interaction between the two magnetic layers which are the readout layer and the recording layer.

In addition, in order to stabilize the recorded information, the recording layer is required that coercive force at room temperature is large and required to have a Curie temperature that an extremely large laser power is not required for recording.

In addition, it is not an object to make it possible to reproduce information with high resolution by magnetic super-resolution described in the above conventional embodiment, but the magneto-optical recording medium, which is arranged such that the magnetic layer of the recording film has a multi-layer structure, has been proposed. For example, Japanese Examined Patent Publication No. 2-35371/1990 (Tokukohei 2-35371) discloses a magneto-optical recording medium which is arranged such that two magnetic layers are laminated each other as a magneto-optical recording medium in which lowering of the recording power does not deteriorate quality of a reproducing signal (S/N ratio) and in which the recorded information is stable with respect to the external magnetic field. The magneto-optical recording medium is composed of (1) the magnetic layer having a high Curie temperature of not less than 200° C. and small coercive force (the magnetic layer corresponding to the readout layer) and (2) the magnetic layer having a low Curie temperature of not more than 200° C. to not less than 50° C. and large coercive force (the magnetic layer corresponding to the recording layer). The magnetic layer (1) is made of amorphous alloy containing Gd—Fe or Gd—Co, and the magnetic layer (2) is made of amorphous alloy containing Tb—Fe or Dy—Fe. The magnetic layer having large coercive force and the magnetic layer having small coercive force are exchange-coupled.

As one of the effects of this arrangement, since the magnetic layer having small coercive force and high Curie temperature which is exchange-coupled with the magnetic layer having large coercive force exists, information is read from the magnetic layer having small coercive force, so a desirable S/N ratio can be obtained at the time of reading out.

In addition, a magneto-optical recording medium where a composition of the magnetic layer is inclined has been proposed. Such a magneto-optical recording medium is disclosed in for example, Japanese Unexamined Patent Publications Nos. 54-121719/1979 (Tokukaisho 54-121719), 63-282945/1988 (Tokukaisho 63-282945) and 5-325283/1993 (Tokukaihei 5-325283). In Japanese Unexamined Patent Publication No. 54-121719/1979, GdCo is used in order to stabilize a writing recording bit thermally and magnetically, and the composition of the magnetic layer is changed in a direction of a film thickness, as an example.

In Publication No. 63-282945/1988, TbFeCo is used as a material of the magnetic layer composed of a single layer, and the composition contains a lot of Tb and a little Co on the light incidence side. As a result, the Kerr rotation angle on the light incidence side becomes large.

In Publication No. 5-325283/1993, as a technique which uses a composition tilt film as a magnetic multi-layer film, a technique which improves sensitivity of a magnetic field by using a two-layer film made of TbFeCo while stability of recording is being maintained.

In addition, in the case where the recording density of the magneto-optical recording medium is further improved, it is desired that a laser beam to be used has a short wavelength, but in an alloy film composed of heavy rare earth metal and transition metal, such as GdFeCo, as the wavelength becomes shorter, the polar Kerr rotation angle ($\theta K$) becomes smaller, and thus the quality of the reproducing signal (C/N) is deteriorated.

Therefore, the following method is generally used. Namely, (1) as described in Journal of Japanese Applied Magnetics Vol. 12, No. 2, 1988, pp. 207–210, in order not to decrease the polar Kerr rotation angle or in order to increase it even when the wavelength is short, the alloy film composed of light rare earth metal and transition metal is used. The journal describes that when Nd—(Fe, Co) alloy is used, the polar Kerr rotation angle is not decreased or it is increased even when the wavelength is short.

(2) In addition, as described in Abstract of one lecture of the 17th lecture meeting held by Applied Magnetics association 10aC-6, the alloy composed of heavy rare earth metal, light rare earth metal and transition metal is used for the reason same as of (1). The journal describes that when the Nd is added to the TbFe, decrease in the polar Kerr rotation angle becomes small in a range of 400 nm to 600 nm.

As mentioned above, it is suggested that when the density of recording is made higher by using a laser beam having a short wavelength, light rare earth metal is added to the readout layer in order to prevent lowering of the quality of the reproducing signal due to the decrease in the polar Kerr rotation angle, but the magneto-optical recording medium where only the light rare earth metal is simply added to the readout layer has the following problems.

Namely, as disclosed in the publication No. 2-35371/1990, for example, in the case of the magneto-optical recording medium which records and reproduces information using the magnetic interaction between two layers, when the light rare earth metal is added to the readout layer, the magnetic layer having small coercive force (readout layer) where an entire magnetic moment has been changed is laminated on the magnetic layer having large coercive force (recording layer), so exchange-coupling force between the readout layer and the recording layer changes. Therefore, when the light rare earth metal is added to the readout layer, the exchange-coupling force changes, thereby arising a problem that the recording and reproducing operations are not carried out properly.

In addition, for example, as disclosed in Japanese Unexamined Patent Publication No. 5-81717/1993 (Tokukaihei 5-81717), in the case of a magneto-optical recording medium which records and reproduces information with high density by utilizing a transition from in-plane magnetization to perpendicular magnetization due to rise in temperature of a readout layer, a magnetic moment of light rare earth metal becomes parallel with a magnetic moment of transition metal. For this reason, when light rare earth metal is added to the readout layer, the magnetic moment of the heavy rare earth metal balances with the magnetic moment of the light rare earth metal—the transition metal, so there is danger of shifting of the threshold temperature to a low temperature. If the threshold temperature becomes too low, there arises a problem that desirable reproducing with high resolution cannot be realized.

In addition, in the magneto-optical recording medium, when the magnetic moment of the light rare earth metal—the transition metal has been already superior to the magnetic moment of the heavy rare earth metal at room temperature, basic properties do not appear such that in-plane magnetization appears at room temperature, whereas a transition occurs from in-plane magnetization to perpendicular magnetization when the temperature rises, thereby deteriorating the basic operation.

SUMMARY OF THE INVENTION

It is an object of the present invention to provide a magneto-optical recording medium which is capable of preventing generation of undesirable recording and reproducing operations due to a change in magnetic interaction and also preventing deterioration in quality of a reproducing signal even when a laser with short wavelength is used.

In order to achieve the above object, a magneto-optical recording medium of the present invention includes magnetic layers is characterized by including a readout layer made of rare earth—transition metal alloy by adding light rare earth metal, in which at least in-plane magnetization appears at room temperature and a transition occurs from in-plane magnetization to perpendicular magnetization when temperature rises, and a recording layer for storing information. Moreover, the magneto-optical recording medium is arranged such that the readout layer has a composition which changes in a direction perpendicular to its film surface so that an amount of the light rare earth metal to be added is larger on a reproducing light incident side than on the recording layer side.

With the above arrangement, since a composition on the recording layer side of the readout layer can be set not to be changed, a change in the magnetic interaction between the readout layer and the recording layer can be suppressed low. Therefore, unacceptable recording and reproducing operations can be prevented. Meanwhile, since the light rare earth metal is added to the reproducing light incident side of the readout layer, decrease in a polar Kerr rotation angle is prevented, thereby making it possible to prevent the deterioration in quality of the reproducing signal.

As a result, high density recording by using the laser of a short wavelength can be achieved as unacceptable recording and reproducing operation due to a change in the magnetic interaction is prevented and also the deterioration in quality of a reproducing signal is prevented.

In addition, as mentioned above, the composition on the recording layer side of the readout layer can be arranged not to be changed, a magnetic moment of the light rare earth metal—transition metal does not balance with a magnetic moment of heavy rare earth metal or the magnetic moment of the light rare earth metal—transition metal is not superior to the magnetic moment of the heavy rare earth metal. As a result, a threshold temperature being an important factor for reproduction with high resolution, at which a transition occurs from in-plane magnetization to perpendicular magnetization, is hardly changed. Therefore, a transition of the readout layer from in-plane magnetization to perpendicular magnetization can be desirably made, and the reproduction with high resolution can be satisfactorily achieved.

As a result, the deterioration in quality of a reproducing signal can be prevented by adding light rare earth metal to the readout layer and high density recording can be achieved by using the laser with short wavelength as the reproduction with high resolution by a transition of the readout layer from in-plane magnetization to perpendicular magnetization is sufficiently achieved.

Also when instead of the light rare earth metal, elements of the platinum group is added to rare earth—transition metal alloy, the same effect as the above can be obtained.

In addition, a method for producing the magneto-optical recording medium includes the first step of preparing a substrate transmitting type sputtering unit for forming a thin film on a substrate while moving the substrate relatively to a target in a predetermined direction and the second step of forming the readout layer on the substrate using the sputtering unit. The above method is characterized by that in the second step, a target for use for forming the readout layer is a target having a different composition of light rare earth metal on an electrode between when the substrate passes into the target and when the substrate passes through the target.

With the above producing method, the readout layer in which its composition changes in the direction perpendicular to the film surface can be appropriately produced by the substrate transmitting type sputtering unit without increasing a number of target electrodes, namely, the only one target electrode is used. Therefore, the desirable magneto-optical recording medium can be produced without enlargement of a size and increase in cost of the apparatus of the sputtering unit.

In addition, another method for producing the magneto-optical recording medium includes the first step of preparing a sputtering unit for forming a thin film on a substrate arranged opposite to a target and the second step of forming the readout layer on the substrate using the sputtering unit. Moreover, the above method is characterized by that the second step adopts a Co-Sputtering method which enables a plurality of targets containing light rare earth metal to be discharged simultaneously in a same sputtering chamber by supplying a sputtering power to a plurality of targets at one time, and ratio of a sputtering power to be supplied to each target varies over time when forming the readout layer. Or the above method is characterized by that in the second step, a plurality of alloy targets containing light rare earth metal which are made of a same material but of different compositions are placed in a same sputtering chamber and that an initial stage of a film forming process is performed by discharging an alloy target having a light rare earth metal composition of a highest density, and thereafter, a target to be discharged is switched from a target having a higher light rare earth metal density to a target having a lower light rare earth metal density so as to form the readout layer.

With the above methods, the layers having different compositions which change in the direction perpendicular to the film surface can be produced in the same sputtering chamber without increasing a number of the sputtering chambers. Therefore, the desirable magneto-optical recording medium can be produced without enlargement of a size and rise in cost of the apparatus of the sputtering unit.

For fuller understanding of the nature and advantages of the invention, reference should be made to the ensuing detailed description taken in conjunction with the accompanying drawings.

BRIEF DESCRIPTION OF THE DRAWINGS

FIG. 4 is a schematic plan view of a sputtering target which is used for explaining another method for producing the magneto-optical recording medium.

FIG. 5 is a schematic plan view of a sputtering target which is used for explaining another method for producing the magneto-optical recording medium.

DESCRIPTION OF THE EMBODIMENTS

Figure 1:
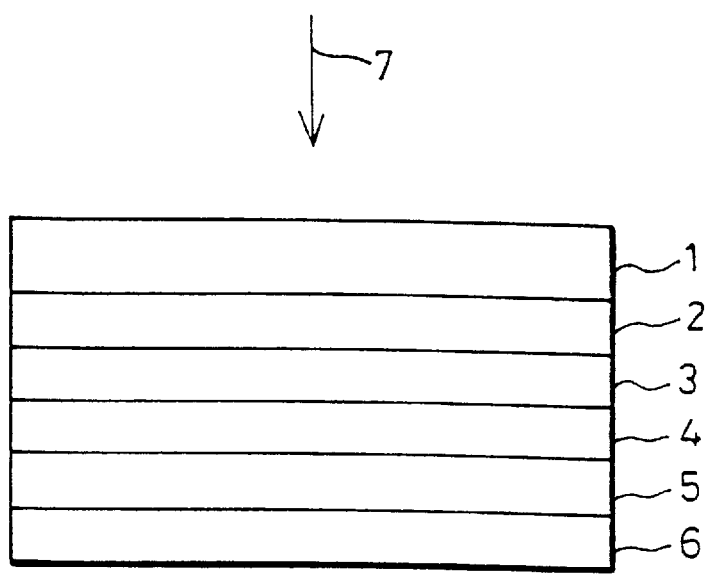
FIG. 1 is an explanatory drawing which shows a schematic arrangement of the magneto-optical recording medium according to one embodiment of the present invention.

The following will discuss one embodiment of the present invention referring to FIGS. 1 through 20.

First, an arrangement of a magneto-optical recording medium of the present embodiment will be explained referring to a schematic cross section of FIG. 1. The magneto-optical recording medium is arranged such that a light transmitting substrate (substrate) 1, a transparent dielectric layer 2, a readout layer 3, a recording layer 4, a protective layer 5 and an overcoat layer 6 are laminated in this order.

The light transmitting substrate 1 is composed of a glass substrate or synthetic resin, such as polycarbonate resin, acrylic resin, amorphous polyolefine, and a guide track for guiding a light beam is formed on one side of the light transmitting substrate 1. The transparent dielectric layer 2 made of AlN having a thickness of 80 nm is formed on the side where the guide track of the light transmitting substrate 1 has been formed.

The readout layer 3 having a thickness of 50 nm composed of GdFeCo to which light rare earth metal composed of Nd is added, for example, is formed on the transparent dielectric layer 2. The readout layer 3 is formed by a producing method mentioned later in such a manner that the Nd is added so that density varies in a direction perpendicular to the film surface. More specifically, the readout layer 3 is formed so that Nd density on a side where a light beam 7 for reproducing enters, namely, on the side of the light transmitting substrate 1 becomes higher than Nd density on the side of the recording layer 4.

The recording layer 4 having a thickness of 50 nm composed of DyFeCo is formed on the readout layer 3.

Moreover, the protective layer 5 made of AlN having a thickness of 20 nm is formed on the recording layer 4. The overcoat layer 6 having a thickness of 5 $\mu$m is formed on the protective layer 5.

The layers 2 to 5 are formed by sputtering without breaking a vacuum. The overcoat layer 6 is formed by projecting an ultraviolet ray for hardening a layer thereto after applying resin by a spin coating unit.

In order to see the varying composition in the direction perpendicular to the film surface of the readout layer 3, the readout layer 3 is analyzed by an Auger electron spectrum method. The sample used for the analysis as a substrate is electrically conductive Si wafer. The sample is arranged such that the Si substrate, an AlN transparent dielectric layer (80 nm), the readout layer (50 nm) and an Al electrically conductive layer (30 nm) are formed in this order.

Figure 2:
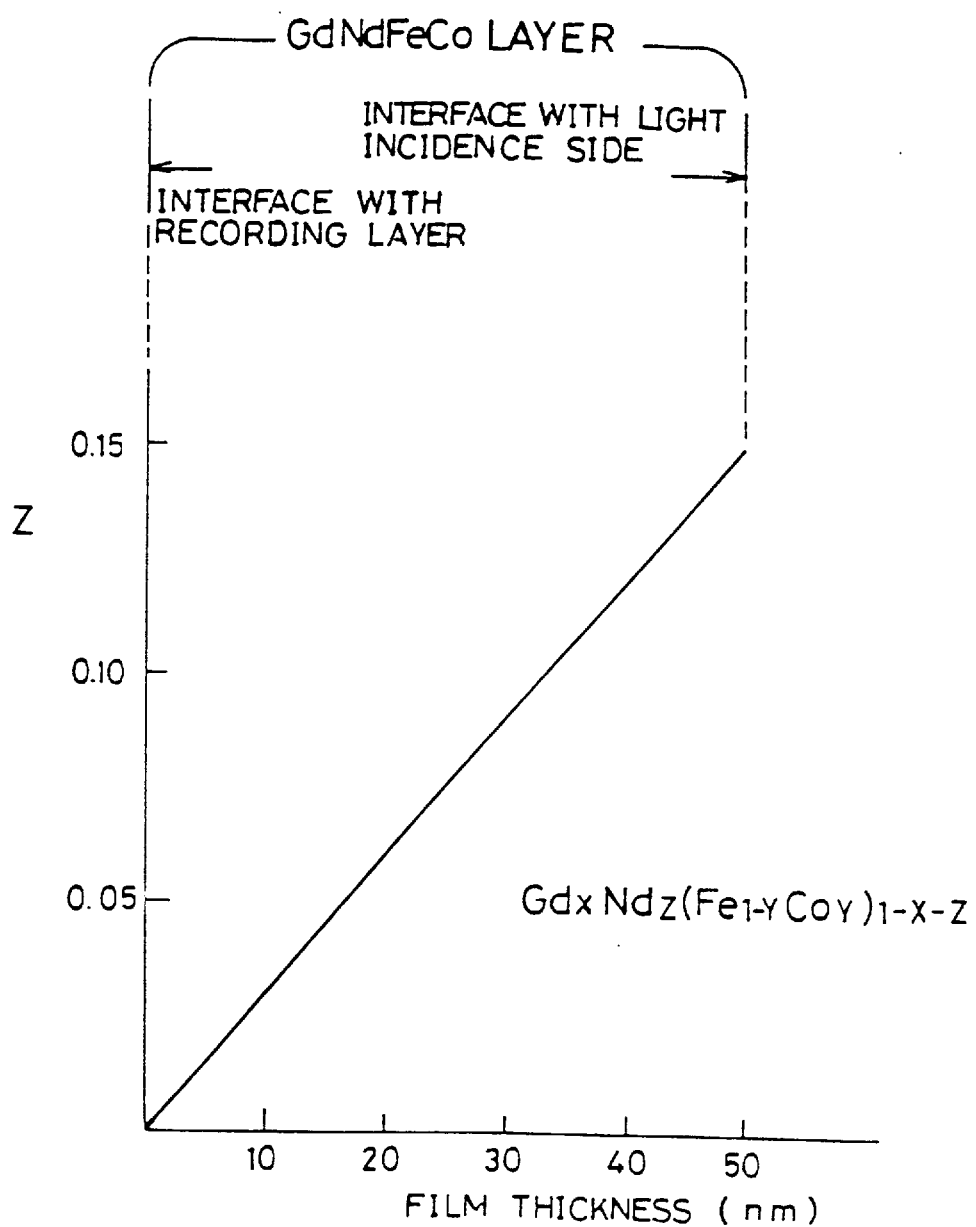
FIG. 2 is a graph which shows results of analyzing Nd density in a direction perpendicular to a film surface of a readout layer in the magneto-optical recording medium.
Figure 3:
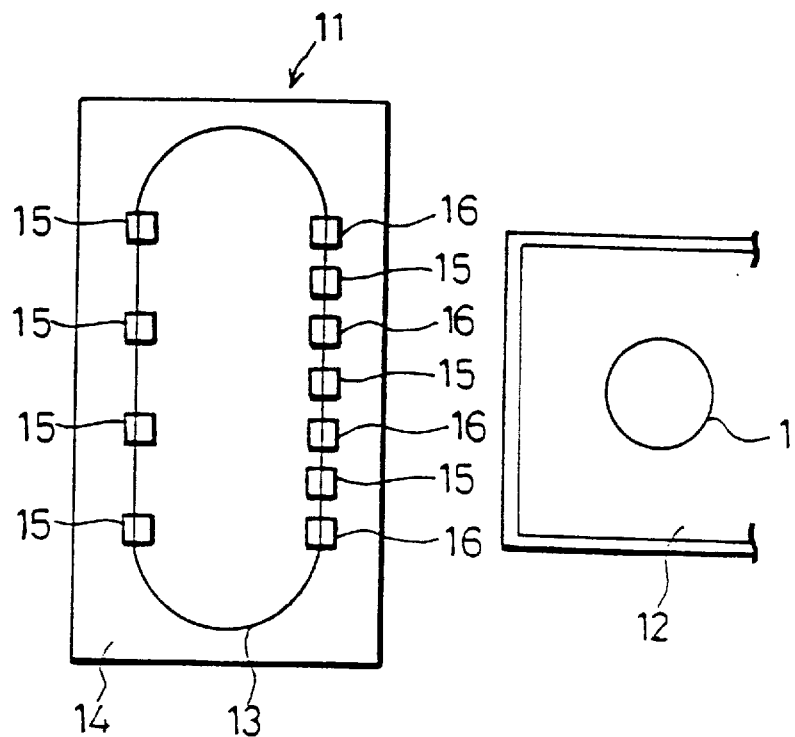
FIG. 3(a) is a schematic plan view of the substrate transmitting type sputtering unit which is used for explaining a method of producing the magneto-optical recording medium.
FIG. 3(b) is a schematic cross section of a target electrode section of the sputtering unit of FIG. 3(a).
Figure 3:
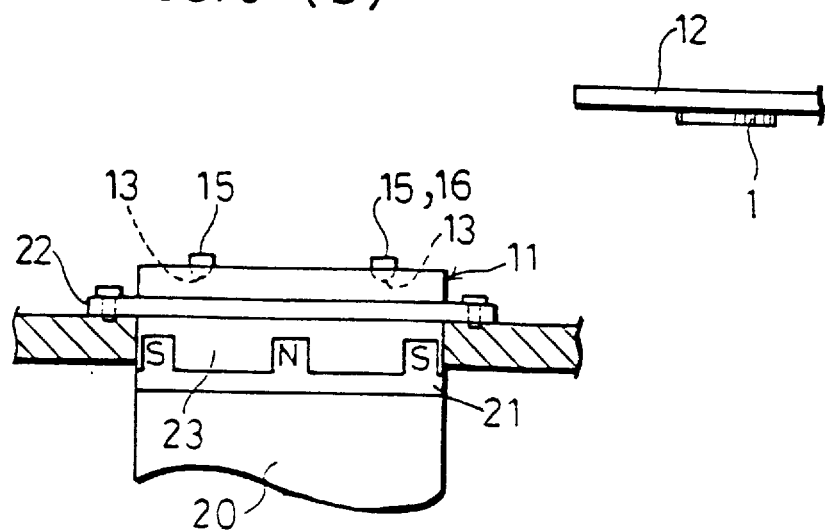
Figure 6:
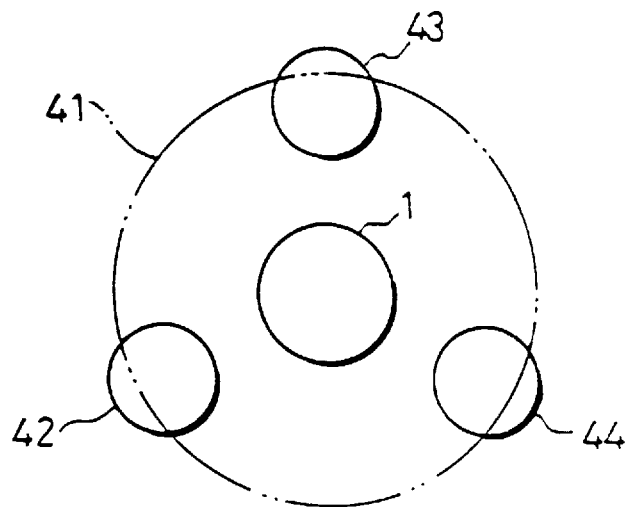
FIG. 6(a) is a schematic plan view of a substrate-opposed type sputtering unit which is used for explaining another method for producing the magneto-optical recording medium.
FIG. 6(b) is a schematic cross section of a target electrode section of the sputtering unit in FIG. 6(a).
Figure 6:
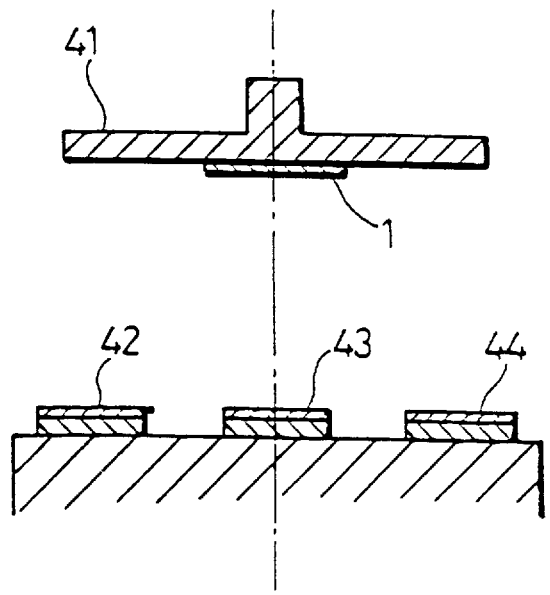

Results of the Auger analysis are shown in FIG. 2. In FIG. 2, x-axis indicates the depth of the analysis corresponding to the readout layer (50 nm). In FIG. 2, y-axis indicates the Nd density Z in GdxNdz $(Fe_1-yCoy)1-x-z$. The point of the film thickness zero corresponds to the interface between the readout layer 3 and the recording layer 4, and the film thickness 50 nm corresponds to the interface on the light incidence side.

FIG. 2 makes it clear that the Nd density Z linearly varies. Moreover, the Nd density Zr on the interface between the readout layer 3 and the recording layer 4 is zero, and the Nd density Zi on the interface on the light incidence side is 0.15. Namely, Nd density inclination is approximately 0.15/50 nm. Density X+Z of whole rare earth metal and Co density Y hardly varied in the direction perpendicular to the film surface, so the density X+Z was 0.25 and the density Y was 0.22.

Composite values of the present embodiment including the Nd density Z in FIG. 2 are based upon the values by XRF analysis. A relationship between the Auger analysis value and the XRF analysis value was investigated based upon results of analysis of a separately provided calibrating sample, and the detected density of each element in the Auger analysis (Gd, Nd, Fe or Co) was compensated so as to be converted to the XRF analysis value.

In the XRF analysis, since an X-ray of significantly higher intensity is applied to the sample compared with the case of the Auger analysis, the X-ray reaches a deeper portion of the sample. Like the sample of the present embodiment, in the case where a total thickness of the recording medium thin film (excluding the overcoat layer 6) is approximately 200 nm, the X-ray reaches the glass substrate, and for example, Si which is a component in glass may be detected.

The XRF analysis is simple and requires only a short period of time. However, since the X-ray reaches the deeper portion, a varying composition in the direction perpendicular to the film surface cannot be detected, and an average value in the direction perpendicular to the film surface can be detected.

The composition of the recording layer 4 is $Dy_{0.23}$ $(Fe_{0.78}Co_{0.22})_{0.77}$. Moreover, a Curie temperature of the recording layer 4 is high enough not to break the recorded information due to recording of information by the reproducing laser power and is low enough to securely record information by moderate recording laser power. In present embodiment, the Curie temperature is adjusted to 200° C. to 250° C. by changing the Dy density or the Co density.

As mentioned above, the magneto-optical recording medium of the present embodiment includes at least (1) the readout layer which has in-plane magnetization at room temperature and where a transition occurs from in-plane magnetization to perpendicular magnetization when the temperature thereof is raised, and (2) the recording layer which keeps information. At this time, the readout layer is made of rare earth—transition metal obtained by adding light rare earth metal such as Nd thereto. Loading of the light rare earth metal to be added to the readout layer changes in the direction perpendicular to the film surface, and the light incidence side (light transmitting substrate 1 side) contains a larger quantity of the light rare earth metal than the other side (recording layer 4 side).

As a result, since the composition on the recording layer 4 side of the readout layer 3 does not change, a change in the magnetic interaction between the readout layer 3 and the recording layer 4 can be restrained low. Therefore, occurrence of undesirable recording and reproducing can be prevented.

Meanwhile, since the light rare earth metal such as Nd is added to the side where the reproducing light enters, decrease in the polar Kerr rotation angle and deterioration in the quality of the reproducing signal can be prevented.

Therefore, even when a laser beam with a short wavelength is used, the recording with high density can be realized while the occurrence of undesirable recording and reproducing due to the change in the magnetic interaction can be prevented and simultaneously deterioration in the quality of the reproducing signal can be prevented.

In addition, as mentioned above, since the composition on the recording layer 4 side of the readout layer 3 does not change, a magnetic moment of Nd (light rare earth metal) —FeCo (transition metal) does not balance with or is superior to a magnetic moment of Gd (heavy rare earth metal). As a result, a threshold temperature at which a magnetization direction of the readout layer 3 is changed from in-plane magnetization to perpendicular magnetization, which is an extremely important factor for the reproducing with high resolution does not drop, namely, the threshold temperature hardly changes. Therefore, a transition of the readout layer 3 satisfactorily occurs from in-plane magnetization to perpendicular magnetization, and the reproducing with high resolution can be sufficiently realized.

For this reason, while the reproducing with high resolution by the transition of the readout layer 3 from in-plane magnetization to perpendicular magnetization is being sufficiently realized, deterioration in the quality of the reproducing signal can be prevented by adding the light rare earth metal to the readout layer 3, and also higher density recording can be realized by using the laser beam with a short wavelength.

In addition, since the rare earth—transition metal alloy of the readout layer 3 is constituted of GdFeCo, even when the laser beam with a short wavelength is used, decrease in the polar Kerr rotation angle is low. For this reason, in the case where the laser beam with a short wavelength is used, deterioration in the quality of the reproducing signal can be prevented more efficiently.

The following will explain the appropriate composition range for GdNdFeCo of the readout layer 3 in the present embodiment. Here, the explanation will be given based upon a composition formula: $Gd_x Nd_z (Fe_{1-y} Co_y)_{1-X-Z}$.

First, the appropriate range for the density Z of Nd to be added will be explained.

It is desirable that an Nd density Zr on the side of an interface between the readout layer 3 and the recording layer 4 is $0 < Zr < 0.01$. In order to prevent a change in the exchange coupling force between the readout layer 3 and the recording layer 4 in every way, it is desirable that the density Zr is as low as possible.

Next, it is desirable that an Nd density Zi on the light incidence side is $0.01 < Zi < 0.20$. Although the density Zi becomes naturally higher than the density Zr on the interface side of the recording layer, even when variation in density is given to the readout layer 3 so that the density Zi becomes slightly higher than the density Zr, the decrease in the polar Kerr rotation angle θk on a short wavelength is controlled, and the quality of the reproducing signal is improved. A density gradient in the present embodiment was 0.15/50 nm. It is possible that the density gradient is set above 0.15/50 nm. However, if the density Zi increases too much, in-plane magnetic anisotoropy becomes too high, and a transition of the readout layer 3 from in-plane magnetization to perpendicular magnetization difficulty occurs. Therefore, it is preferable that Zi is below 0.20 in the practical applications.

Figure 19:
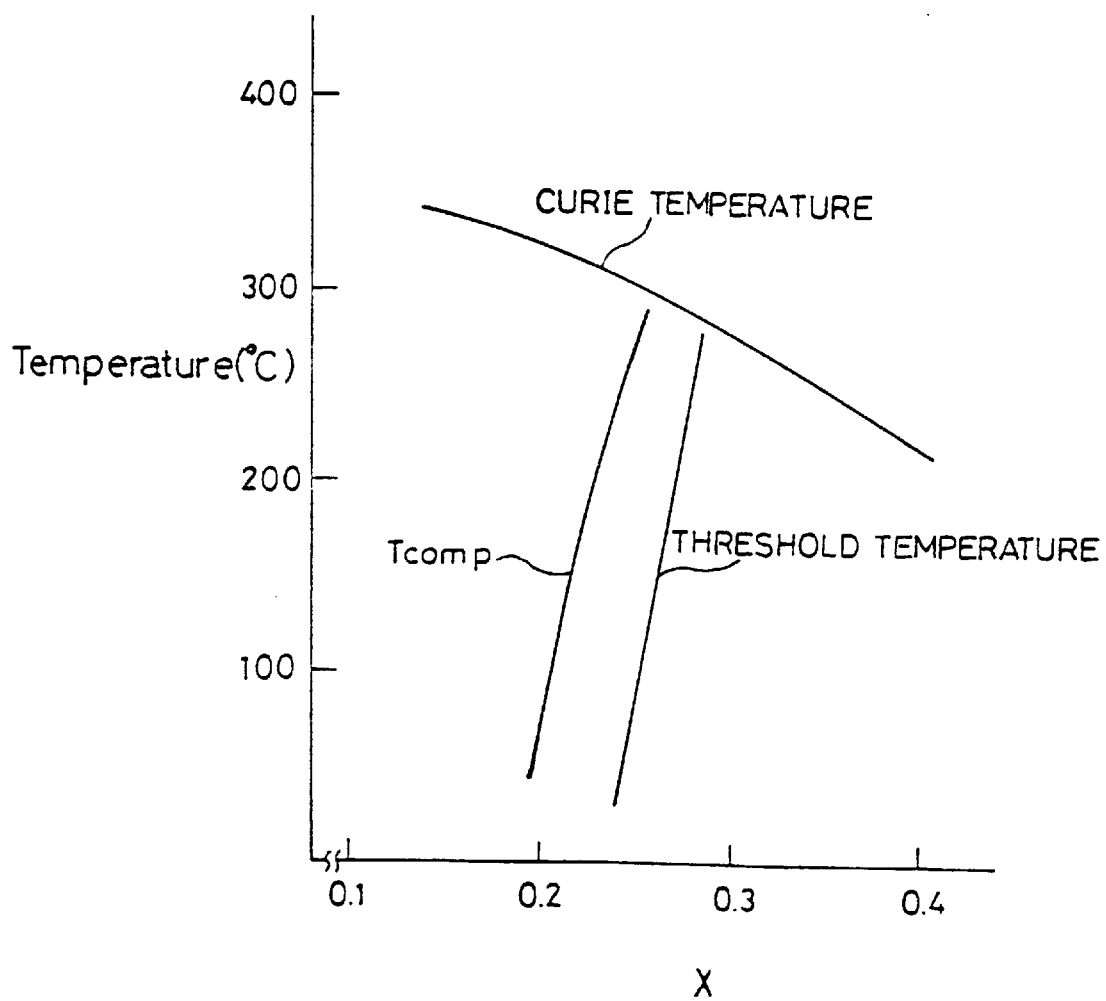
FIG. 19 is a graph which shows mutual relation between Gd density and a magnetic characteristic of the readout layer of the magneto-optical recording medium in FIG. 1.

Next, the following will describe the Gd density. FIG. 19 is a graph which shows a change in the Curie temperature, in the threshold temperature at which a transition occurs from in-plane magnetization to perpendicular magnetization and in Tcomp (magnetic compensation temperature: temperature at which hysteresis conversion is made) in the case where an x-axis indicates the Gd density X.

First, according to the above-mentioned reasons, in order to prevent a change in the exchange coupling force between the readout layer 3 and the recording layer 4, it is desirable that the Gd density X on the side of an interface between the readout layer 3 and the recording layer 4 is 0.25±0.05. Moreover, it is desirable that the composition of the whole rare earth metal is in a range of X+Z=0.25±0.05.

This is because the reproducing with high density cannot be carried out when the threshold temperature is not above room temperature and also because the reproducing laser power increases too much when the threshold temperature is not below 200° C., thereby arising problems that recording to the recording layer 4 is carried out at the time of reproducing and that life of the laser beam is shorten.

Figure 20:
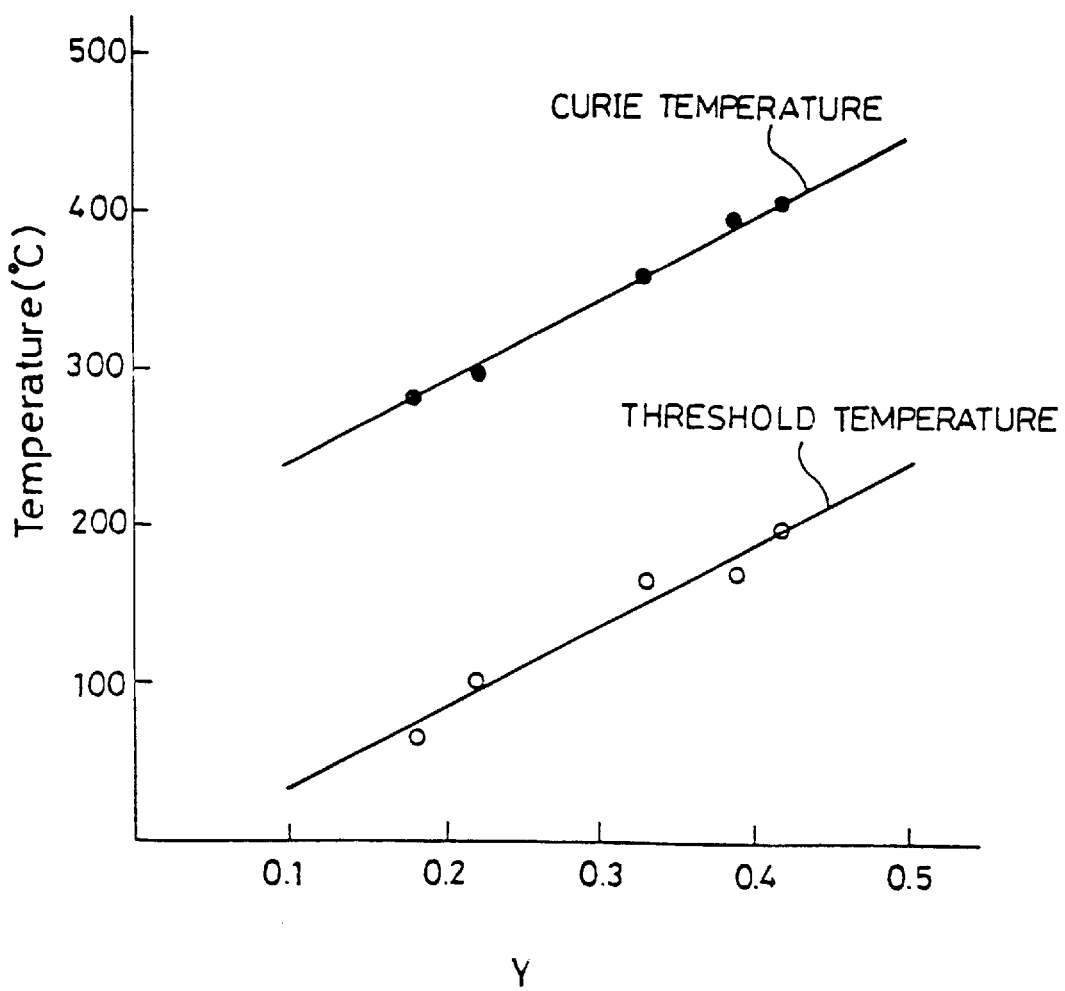
FIG. 20 is a graph which shows mutual relation between Co density and the magnetic characteristic of the readout layer of the magneto-optical recording medium in FIG. 1.
Figure 21:
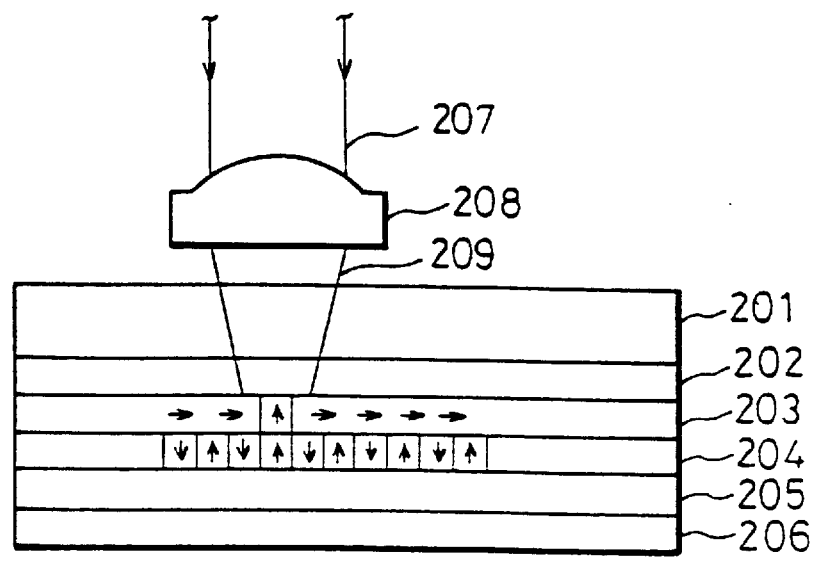
FIG. 21 is an explanatory drawing which shows a schematic arrangement of a conventional magneto-optical recording medium.
Figure 22:
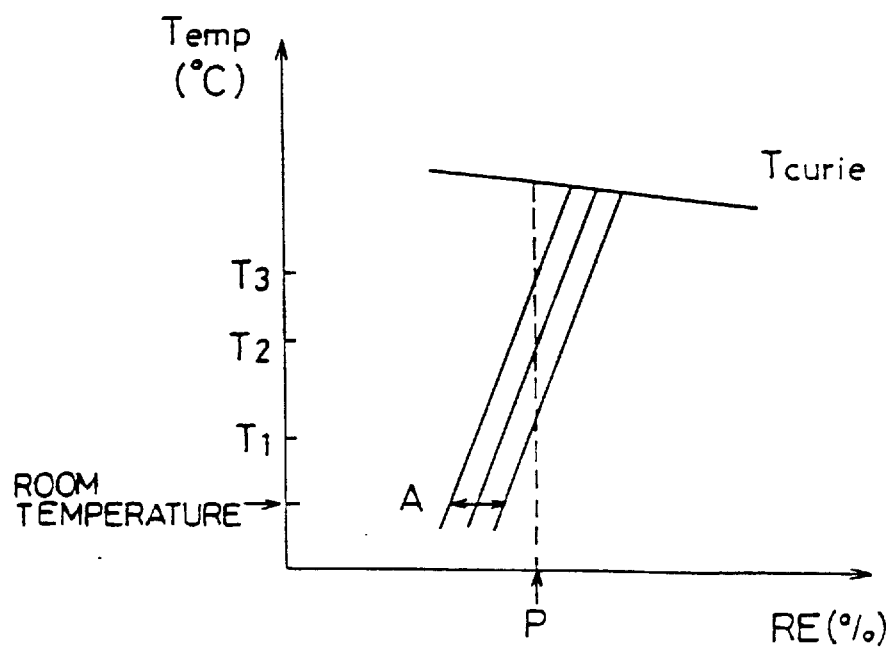
FIG. 22 is an explanatory drawing of a magnetic state which shows the magnetic characteristic of the readout layer of the magneto-optical recording medium.
Figure 23A:
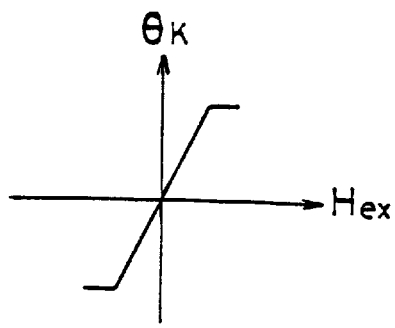
FIGS. 23(a) through 23(d) are explanatory drawings which shows a relationship between an external applying magnetic field to be applied to the readout layer and a polar Kerr rotation angle in the magneto-optical recording medium.
Figure 23B:
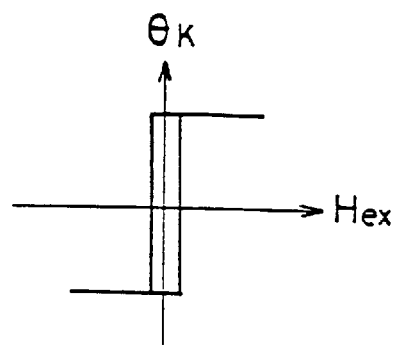
Figure 23C:
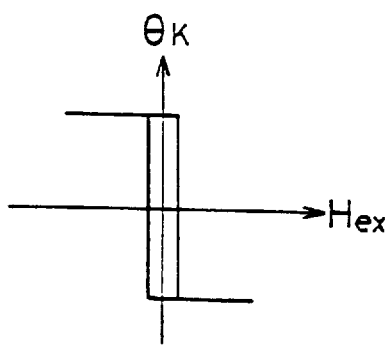
Figure 23D:
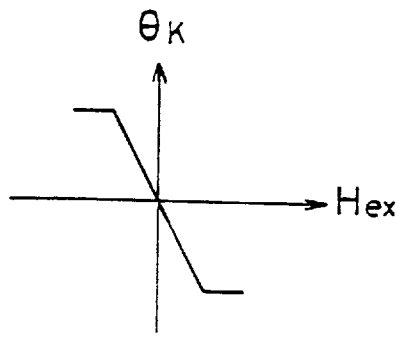
Figure 24:
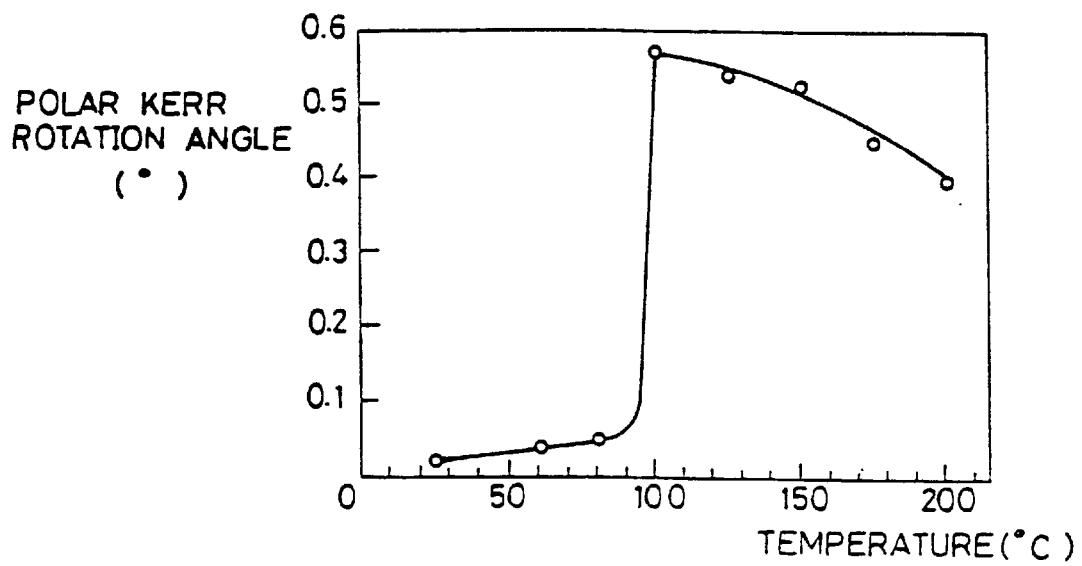
FIG. 24 is a graph which shows one example of a temperature dependency of the polar Kerr rotation angle of the readout layer in the magneto-optical recording medium.
Figure 25:
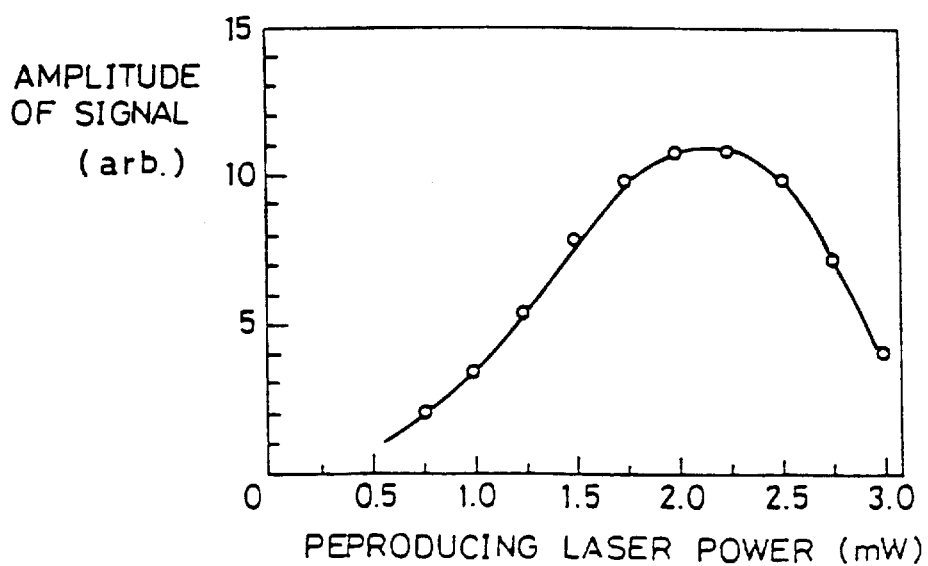
FIG. 25 is a graph which shows a relationship between a reproducing laser power and an amplitude of the reproduced signal in the magneto-optical recording medium having the characteristic shown in FIG. 24.

Next, the following will describe the Co density Y. FIG. 20 is a graph which shows a change in the Curie temperature and the threshold temperature in the case where an x axis indicates the Co density Y. The following will discuss the appropriate range for the Co density Y in the present embodiment in the case where the Gd density X is 0.25.

It is desirable that the Co density Y is in the range of $0.1 < Y < 0.40$. According to the results of the above experiment, in the case where Y is 0.4, the threshold temperature rises to 200° C., and thus the recording to the recording layer 4 is possibly carried out at the time of reproducing. Moreover, in order to set the threshold temperature higher than room temperature, it is necessary to satisfy $0.1 < Y$ as shown in the drawing. However, if Y is set too high, the in-plane magnetization anisotoropy becomes too high, so the transition from in-plane magnetization to perpendicular magnetization difficulty occur. For this reason, it is desirable that Y is below 0.4 in practical applications.

[PRODUCING METHOD]

Next, the following will describe a method for producing the magneto-optical recording medium of the present embodiment. The magneto-optical recording medium has a basic arrangement that the composition of light rare earth metal can incline in the direction perpendicular to the film surface. The magneto-optical recording medium of the present embodiment is produced by a sputtering method.

Here, the description will divided into a method using a substrate transmitting type sputtering unit, a method using a substrate opposed-type sputtering unit and a method using a rotatory sputtering unit. These methods are related to methods for forming recording medium films on the light transmitting substrate 1, namely, the transparent dielectric film 2, the readout layer 3, recording layer 4 and the protective layer 5.

First, the following will discuss the first method for producing the magneto-optical recording medium of the present embodiment using the substrate transmitting type sputtering unit. Here, the substrate transmitting type sputtering unit suggests that when forming films, the substrate (light transmitting substrate 1) crosses a target. In this producing method, Nd is added to the GdFeCo layer as the readout layer 3 and the Nd density is changed in the direction perpendicular to the film surface.

The following will mainly discuss a method for producing the readout layer referring to FIGS. 3(a) and 3(b).

FIG. 3(a) is a schematic plan view taken from above the sputtering unit. FIG. 3(b) is a schematic cross section of a target electrode section. A tray 12 provided with the light transmitting substrate 1 crosses a target 11 for use in forming the readout layer 3 from the right end to the left end in the figure so as to form the readout layer 3 on the light transmitting substrate 1 (Here, a single light transmitting substrate 1 was prepared in the drawing). Needless to say, the transparent dielectric film 2 is formed on the light transmitting substrate 1 before forming the readout layer 3.

Next, the target 11 for use in forming the readout layer 3 will be explained.

Many sputtering units employ magnetron sputtering which accelerates the film forming rate, and the present embodiment employs the sputtering unit of this type. The target 11 bonded to a backing plate 22 is mounted on an electrode section 20 for supplying power such as DC or RF to the target 11. A cooling section 23 for cooling the target 11 by water is provided on the upper portion of the electrode section 20. Moreover, a magnet 21 is fitted in or provided to the cooling section 23 via a detachable mechanism.

A magnetic leakage flux occurs in the vicinity of the surface of the target 11 by the magnet 21, and this captures and houses an electron. As a result, since plasma is converged, the sputtering efficiency is improved. When the plasma is converged and the sputtering is selectively formed, an erosion 13 is formed.

The target 11 is composed of an FeCo base target 14 made of FeCo alloy, plate-like Gd chips 15 . . . and plate-like Nd chips 16 . . . . The Gd chips 15 . . . and the Nd chips 16 . . . are arranged on the erosion 13 formed on the FeCo base target 14. The Nd density can be changed by changing a size of these chips and intervals of the chips.

In the producing method of the present embodiment, the Nd chips 16 . . . are arranged only on a side of the erosion 13 where the tray 12 passes into. As a result, the readout layer composition on the side where the readout layer 3 is started to form, namely, on the light transmitting substrate 1 side contains a lot of Nd, and the readout layer composition on the side where the tray 12 passes through, namely, on the recording layer 4 side to be formed next contains few Nd. This is demonstrated by the results of the analysis of the composition in the direction perpendicular to the film surface in FIG. 2 as mentioned above.

Incidentally, in the experiment on the producing method, a ratio of the Fe to Co in the FeCo base target 14 was set so as to be the same ratio of the composition of the readout layer 3. The readout layer 3 formed by the target 11 is the sample of the embodiment.

With the producing method of the present embodiment, as mentioned above, it is clear from the results of the analysis of the composition that the Nd density in the direction perpendicular to the film surface can be changed.

In addition, in order to change inclination of the Nd density by the above method, a shape (area) of the Nd chips 16 . . . arranged on the right side of the erosion 13 is changed so as to be arranged on the both sides of the erosion 13. In order to increase the inclination of the Nd density, the Nd chips 16 with a large area are arranged, and in order to decrease the inclination of the erosion 13, the Nd chips 16 with a s mall area are arranged As mentioned above, with the above producing method, as the target used for forming the readout layer 3 by the substrate transmitting type sputtering unit, the target 11 whose composition on the electrode on the side where the tray 12 provided with the light transmitting substrate 1 passes into is different from that on the side where the tray 12 passes through is used so as to form the readout layer 3 on the light transmitting substrate 1.

For this reason, since the readout layer 3 whose composition changes in the direction perpendicular to the film surface can be appropriately produced, the magneto-optical recording medium of the present embodiment can be appropriately produced without improper distribution of the composition.

In addition, it is not necessary to increase the target electrode, namely, only one target electrode is sufficient, thereby making it possible to produce the desirable magneto-optical recording medium without enlargement of the sputtering unit and increase in cost.

Next, the following will discuss the second producing method using the substrate transmitting type sputtering unit to which the first producing method is applied referring to FIG. 4. The target 11 used for forming the readout layer 3 is composed of a GdFeCo alloy target 31 and the plate-like Nd chips 16 . . . . The Nd chips 16 . . . are arranged only on the side of the erosion 13 where the tray 12 passes into.

Also in this case, in the same manner as in the first producing method, in order to change the inclination of the composition of the Nd density, a shape (area) of the Nd chips 16 . . . arranged on the right side of the erosion 13 is changed so as to be arranged on the both sides of the erosion 13. In order to increase the inclination of the composition, the Nd chips 16 with a large area are arranged, and in order to decrease the inclination of the composition, the Nd chips with a small area are arranged.

Next, the following will discuss the third producing method using the substrate transmitting type sputtering unit, to which the above producing method is applied referring to FIG. 5.

The target 11 used for forming the readout layer 3 is composed of a GdNdFeCo alloy target 32 and the GdFeCo alloy target 31.

The GdNdFeCo alloy target 32 is arranged on the side the tray 12 passes into, and the GdFeCo alloy target 31 is arranged on the side where the tray 12 passes through. Since the portion where the erosion 13 is formed has a race-track-shape shown in FIG. 5, it is sufficient to arrange two kinds of members with different composition in a direction the tray 12 passes.

Next, the following will discuss a producing method in the case where the magneto-optical recording medium of the present embodiment is produced by using the substrate opposed-type sputtering unit. Here, the substrate opposed-type sputtering unit suggests that a substrate is mounted to a disk-like substrate holder and a target is arranged on an opposite portion to the substrate holder.

FIGS. 6(a) and 6(b) are schematic drawings which show one example of the substrate opposed-type sputtering unit. FIG. 6(a) is a plan view taken from above the sputtering unit. FIG. 6(b) is a cross section of the sputtering unit. In order to simplify the description, the description in the case where the light transmitting substrate 1 is mounted to the center of a disk holder 41 will be given. The disk holder 41 rests or rotates during sputtering.

For forming the readout layer 3, a Gd target 42, an Nd target 43 and an FeCo target 44 are used. When the readout layer 3 is formed, the three targets are simultaneously discharged so that the GdNdFeCo film is formed by sputtering. Such a sputtering method is called as Co-Sputtering method. In the Co-Sputtering method, the composition of the film is adjusted by altering a supplied power to each target.

In the magneto-optical recording medium of the present embodiment, the Nd composition of the readout layer 3 changes in the direction perpendicular to the film surface. The readout layer 3 can be produced by controlling the supplied power in the following manner. Here, on the light transmitting substrate 1, the transparent dielectric layer 2 has been already formed by a reacting sputtering method in which an Al target (not shown) is sputtered in an atmosphere of nitrogen gas.

In the initial stage of forming the readout layer 3, i.e., on the side of an interface between the readout layer 3 and the transparent dielectric layer 2, the supplied power to the Nd target 43 is set relatively large, and the supplied power to the Gd target 42 is set relatively small. Thereafter, the supplied power to the Nd target 43 is gradually made smaller, and the supplied power to the Gd target is gradually made larger. At this time, the supplied power to the FeCo target 44 is controlled so as to be substantially constant, and a total of the respective supplied power to each target is controlled so as to be substantially constant.

According to the above producing method, the readout layer 3, in which the Nd density is set high on the interface side between the readout layer 3 and the transparent dielectric layer 2 and is set low on the interface side between the readout layer 3 and the recording layer 4, can be formed.

Figure 7:
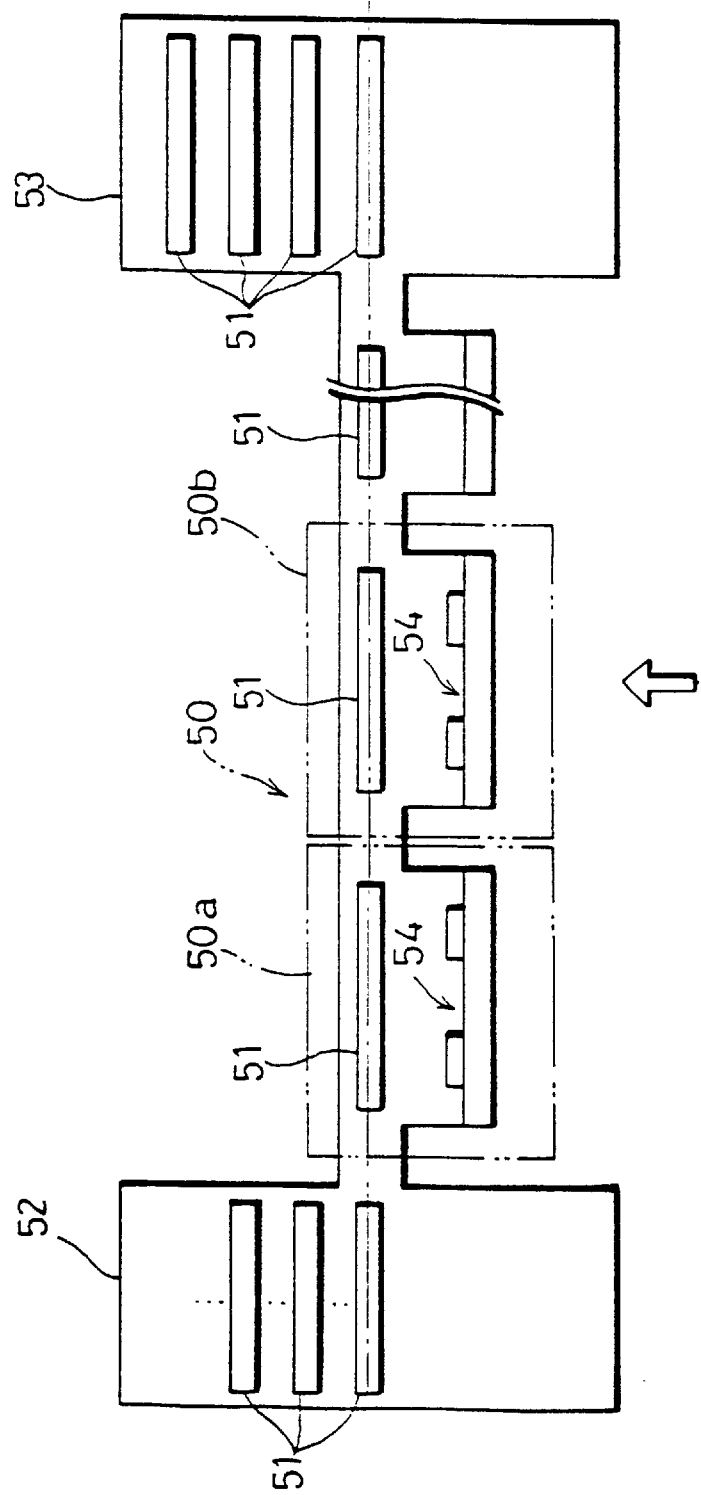
FIG. 7 is a schematic overall view of a rotatory sputtering unit which is used for explaining another method for producing the magneto-optical recording medium.
Figure 8:
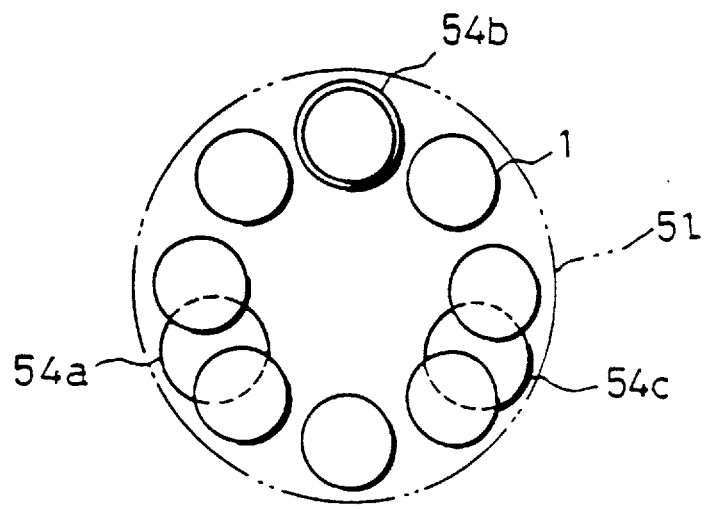
FIG. 8(a) is a schematic plan view of a sputtering chamber of the rotatory sputtering unit in FIG. 7 for forming a readout layer.
FIG. 8(b) is a schematic cross section of a target electrode section of the sputtering chamber in FIG. 8(a).
Figure 8:
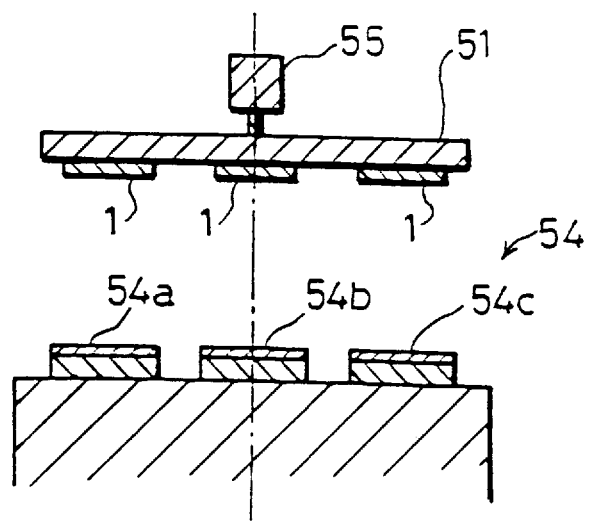
Figure 9:
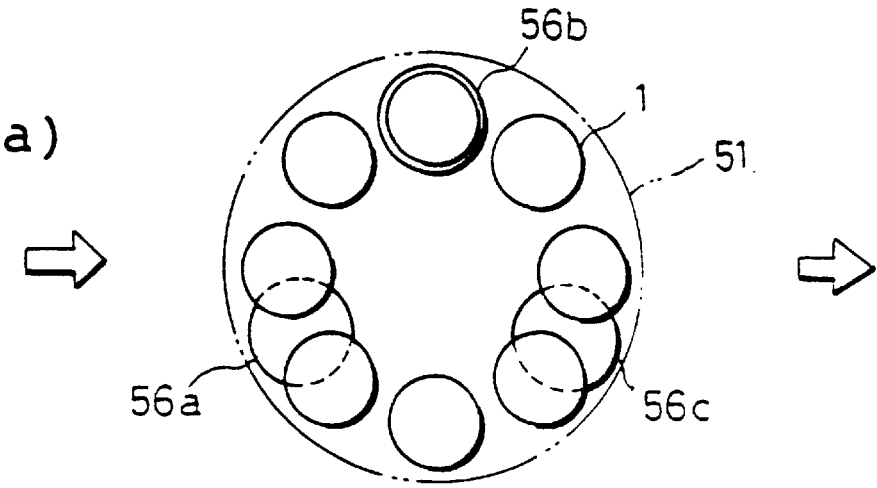
FIG. 9(a) is a schematic plan view of a sputtering chamber of the rotatory sputtering unit for forming a readout layer, which is used for explaining another method for forming the magneto-optical recording medium.
FIG. 9(b) is a schematic cross section of a target electrode section of the sputtering unit in FIG. 9(a).
Figure 9:
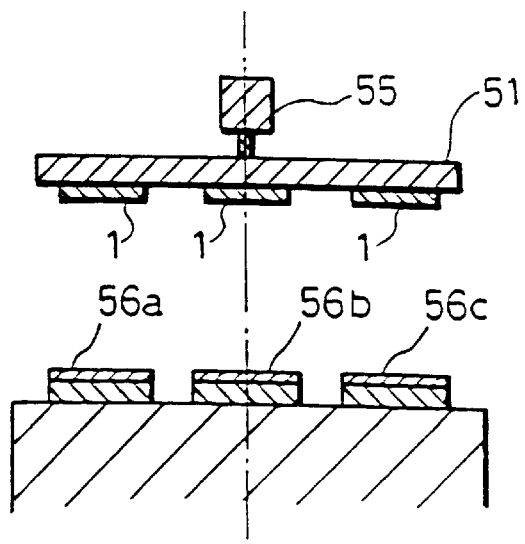

Next, the following will discuss the first producing method in the case where the magneto-optical recording medium of the present embodiment is produced using the rotatory sputtering unit referring to FIG. 7, FIGS. 8(a) and 8(b).

FIG. 7 is a schematic overall view which show one example of a sputtering unit used for mass production which is called as the rotatory sputtering unit, and which is taken from above the sputtering unit. FIG. 8(a) is a schematic side view taken from the direction of an arrow in FIG. 7. Moreover FIG. 8(b) is a plan view taken from above the FIG. 8(a).

In the rotatory sputtering unit, a plurality of light transmitting substrates 1 are respectively mounted to holders which are called as pallets 51. The sputtering unit is generally composed of a load chamber 52, a sputtering chamber 50 and an unload chamber 53. In the load chamber 52, a plurality of pallets 51 . . . whereon each light transmitting substrate 1 on which a film is not yet formed is mounted are placed, and the pallets 51 . . . are successively led to the sputtering chamber 50 by a transportation mechanism. In general, only one layer is formed on one sputtering chamber. Namely, in order to form the magneto-optical recording medium having the arrangement of the present embodiment, i.e., including the transparent dielectric layer 2, the readout layer 3, the recording layer 4 and the protective layer 5, four sputtering chambers 50a, 50b . . . are required including the first sputtering chamber for forming the transparent dielectric layer 2, the second sputtering chamber for forming the readout layer 3

When the pallet 51 is transported from the load chamber 52 to a proper position (generally, the center) of the first sputtering chamber 50a (the transportation of the pallet 51 is temporarily held in this position), a sputtering film is formed by a single target 54 or a plurality of targets 54 placed so as to face in the sputtering chamber 50 while being rotated by a rotatory motor 55. During the film forming process, the light transmitting substrate 1 is also rotating (rotation) separately from the rotation (revolution) of the pallet 51.

When the first layer (transparent dielectric layer 2) has been formed, the pallet 51 is transported to the next sputtering chamber 50b in order to form the readout layer 3. At this time, the next pallet 51 is transported from the load chamber 52 to the sputtering chamber 50a for forming the first layer.

When all the films have been formed, the pallet 51 is transported to the unload chamber 53 and is stored therein. After setting back the pressure to the air pressure, the substrate 1 is taken out of the pallet 51 thereby, completing the film forming process.

The producing method of the present embodiment adopts the Co-Sputtering method in which three single targets are used for the above-mentioned rotatory sputtering unit. The Co-Sputtering method was explained in the producing method using the substrate opposed-type sputtering unit.

In order to form the readout layer 3, as the target 54 in the sputtering chamber 50b for forming the readout layer 3, three single targets including a Gd target 54a, an Nd target 54b and an FeCo target 54c are used. The three targets are simultaneously discharged by the Co-Sputtering method so that the GdNdFeCo film is formed.

In the magneto-optical recording medium of the present embodiment, the Nd composition of the readout layer 3 changes in the direction perpendicular to the film surface. The readout layer 3 can be produced by controlling a supplied power to each target in the manner same as in the producing method using the substrate opposed-type sputtering unit.

In other words, in the initial stage of forming the readout layer 3, i.e., on the interface side between the readout layer 3 and the transparent dielectric layer 2, the supplied power to the Nd target 54b is set relatively large, and the supplied power to the Gd target 54a is set relatively small. Then, the supplied power to the Nd target 54b is gradually made smaller, and the supplied power to the Gd target 54a is gradually made larger. At this time, the supplied power to the FeCo target 54c is controlled so as to be constant, and a total of the respective supplied powers to each target is controlled so as to be substantially constant.

As a result, the readout layer 3 can be formed so that the Nd density is set high on the interface between the readout layer 3 and the transparent dielectric layer 2 and is set low on the interface between the readout layer 3 and the recording layer 4.

When the producing method using the rotatory sputtering unit is used, it is not necessary to additionally provide another sputtering chamber 50 in order to change the composition of the readout layer 3 in the direction perpendicular to the film surface. Therefore, the method is excellent in terms of throughput (processing ability), cost, and required installation space.

Next, the following will discuss the second producing method using the rotatory sputtering unit, to which the above producing method is applied, referring to FIGS. 9(a) and 9(b). Here, similarly to FIGS. 8(a) and 8(b), FIGS. 9(a) and 9(b) are schematic drawing of the sputtering chamber for forming the readout layer 3 by the rotatory sputtering unit.

In the producing method of the present embodiment, not less than two or three GdNdFeCo alloy targets, or not less than two or three GdNdFeCo alloy targets and the GdFeCo alloy targets are used instead of the Gd, Nd, FeCo targets used for the first producing method.

In the producing method of the present embodiment, three GdNdFeCo alloy targets 56a, 56b and 56c each having different composition are used. Here, the target 56a has the highest Nd density, the target 56b has intermediate Nd density and the target 56c has the lowest Nd density. Incidentally, as the target 56c, the GdFeCo alloy target containing no Nd may be used.

First, the moment or just before only the target 56a having the highest Nd density is discharged and is sputtered for a prescribed time, it is switched to discharge the target 56b having the intermediate Nd density, thereby forming the layer by the target 56b. Thereafter, it is switched to discharge the target 56c having the lowest Nd density thereby forming the layer by the target 56c so as to form the readout layer 3.

At this time, according to the contents of the present embodiment, it is clear that not less than three alloy targets may be used, but if a number of electrodes increases, cost of the apparatus becomes high. According to the results of the experiment on the recording medium of the above-mentioned embodiment, it is clear that when the composition of the readout layer 3 in the direction perpendicular to the film surface changes on the boundary surface of the light incidence side and the recording layer 4, the particular effects of the present invention can be achieved. Considering the above, the necessary number of the alloy targets is 2 or 3.

When the producing method of the present embodiment is used, it is not necessary to additionally provide another sputtering chamber for changing the composition of the readout layer 3 in the direction perpendicular to the film surface, so the method is excellent in terms of throughput (processing ability), cost, and required installation space. Moreover, since the alloy target is used for the producing method of the present embodiment, the magneto-optical recording medium which has an excellent reproducibility can be achieved.

The above described the methods for producing the magnetic layer in which the density of the light rare earth metal such as Nd is different on one surface and the other surface, i.e., the readout layer 3, by using the substrate transmitting type sputtering unit, the substrate opposed-type sputtering unit and the rotatory sputtering unit. However, the method for changing the density of the light rare earth metal is not limited to the above producing methods.

In addition, the above-mentioned producing methods are not limited to the magneto-optical recording medium of the present embodiment. For example, needless to say, the methods are applicable to a magneto-optical recording medium having only one magnetic layer. Moreover, regarding the optical memory for use for forming thin films using the sputtering unit, if it is necessary to change the composition in the direction perpendicular to the film surface, the producing methods are applicable.

In addition, in the present embodiment, only the GdNdFeCo was used as the material of the readout layer 3, but the present invention is not limited to this, so another rare earth—transition metal alloy, such as GdNdFe, GdNdCo, TbNdFeCo, DyNdFeCo, HoNdFeCo, can be also adopted.

In addition, the light rare earth metal to be added is not limited to Nd, and one which can improve the polar Kerr rotation angle θk in a short wavelength may be used. For example, Pr, Sm, etc. may be used. Moreover, instead of the light rare earth metal, elements of the platinum group, such as Pd, Pt, may be added.

In the case where Pt is added to a layer, the layer has also an effect for improving moisture resistance. Moreover, even when a large amount of Pr is added to a layer, the material of the layer is still amorphous, so a noise does not increase due to a crystal grain boundary. Moreover, Sm is more inexpensive than Pt. In the case where Pd is added to a layer, the layer have an effect for improving moisture resistance, and since Pd reserves are greater than Pt reserves, the Pd is inexpensive.

In addition, the magneto-optical recording medium of the present invention is applicable to variety of cases. For example, the magneto-optical recording medium of the present invention can be applied to the following arrangements. Concrete examples of the recording medium to which the present invention is applicable will be explained referring to FIGS. 10 through 16. For convenience in explanations, names of each magnetic layer and main functions thereof are summarized in Table 1. In Table 1, the reference numerals for the respective layers in FIGS. 10 through 16 are shown in the brackets.

TABLE 1

| | |
|---|---|
| readout layer (60R) | magnetic layer for obtaining reproduced information |
| recording layer (60W) | magnetic layer for storing recorded information |
| auxiliary recording layer (60 Ws) | magnetic layer that serves as an auxiliary layer for recording information on the recording layer (enabling an overwriting by the light intensity modulation) |
| Initializing layer (60I) | magnetic layer for initializing a magnetization in the auxiliary recording layer in one direction (enabling an overwriting by the light intensity modulation) |
| Switching layer (60S) | magnetic layer for controlling |
| Intermediate layer (60Im) | magnetic interaction between magnetic layers |

Figure 10:
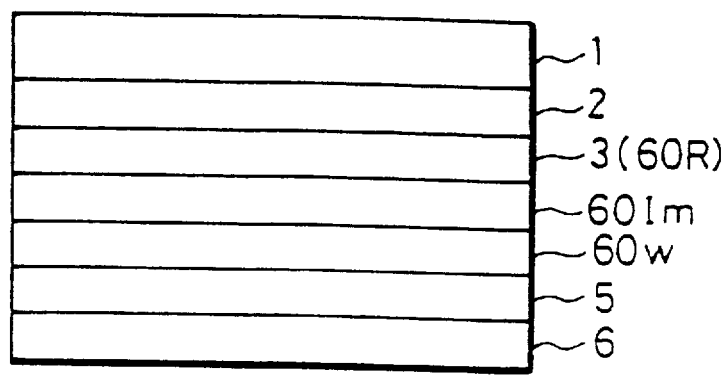
FIG. 10 is an explanatory drawing which shows another schematic arrangement of the magneto-optical recording medium.

The medium having the arrangement of a three magnetic layered structure, shown in FIG. 10 is composed of the light transmitting substrate 1, the transparent dielectric layer 2, the readout layer 3 (60R), the intermediate layer 60Im, the recording layer 60W, the protective layer 5 and the overcoat layer 6.

Figure 11:
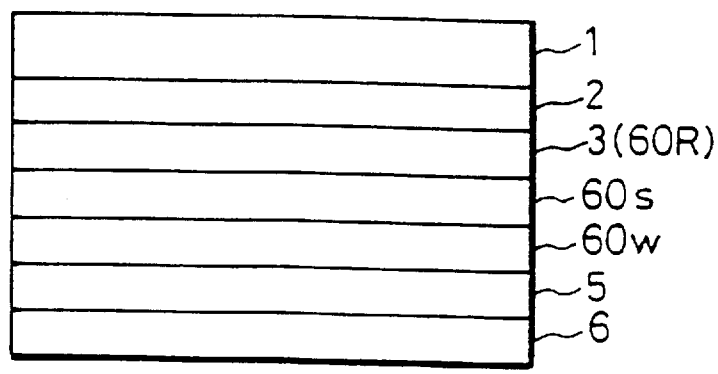
FIG. 11 is an explanatory drawing which shows another schematic arrangement of the magneto-optical recording medium.

The medium having the arrangement of a three magnetic layered structure, shown in FIG. 11 is composed of the light transmitting substrate 1, the transparent dielectric layer 2, the readout layer 3 (60R), the switching layer 60S, the recording layer 60W, the protective layer 5 and the overcoat layer 6.

Figure 12:
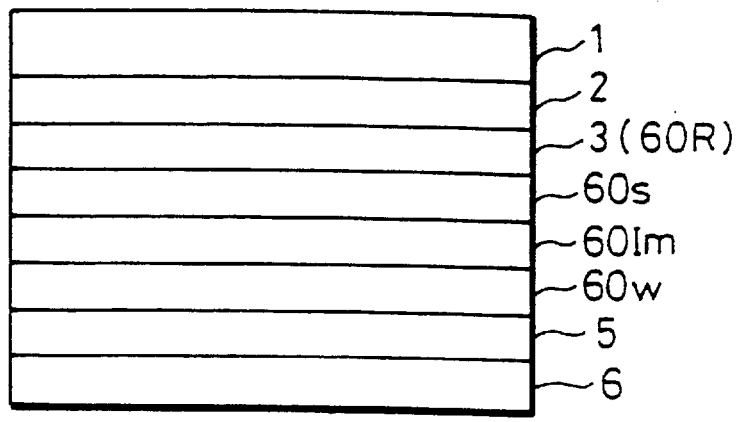
FIG. 12 is an explanatory drawing which shows another schematic arrangement of the magneto-optical recording medium.

The medium having the arrangement of a four magnetic layered structure, shown in FIG. 12 is composed of the light transmitting substrate 1, the transparent dielectric layer 2, the readout layer 3 (60R), the switching layer 60S, the intermediate layer 60Im, the recording layer 60W, the protective layer 5 and the overcoat layer 6.

Figure 13:
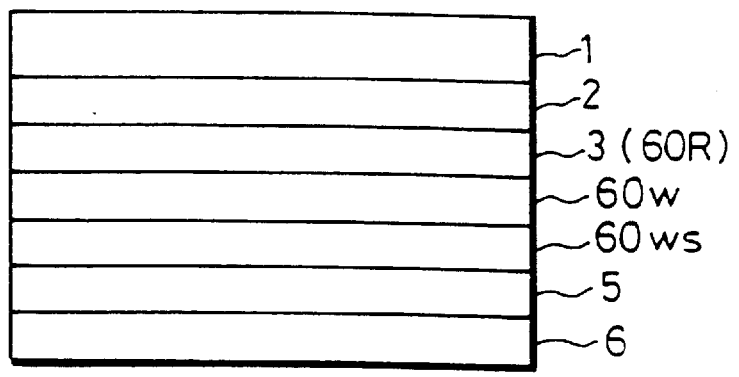
FIG. 13 is an explanatory drawing which shows another schematic arrangement of the magneto-optical recording medium.

The medium having the arrangement of a three magnetic layered structure, shown in FIG. 13 is composed of the light transmitting substrate 1, the transparent dielectric layer 2, the readout layer 3 (60R), the recording layer 60W, the auxiliary recording layer 60Ws, the protective layer 5 and the overcoat layer 6.

Figure 14:
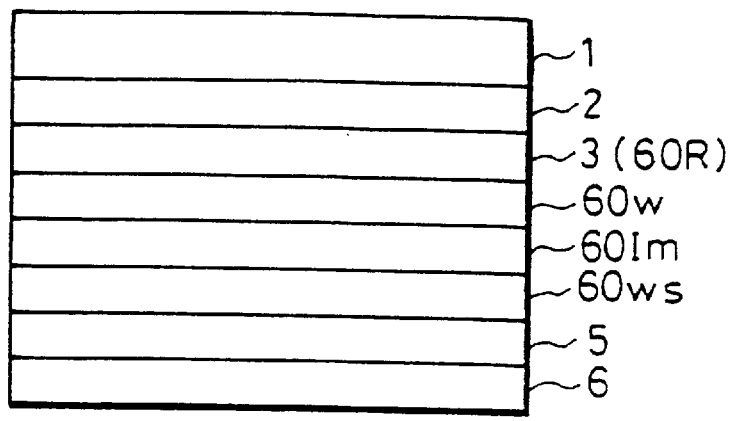
FIG. 14 is an explanatory drawing which shows another schematic arrangement of the magneto-optical recording medium.

The medium having the arrangement of a four magnetic layered structure, shown in FIG. 14 is composed of the light transmitting substrate 1, the transparent dielectric layer 2, the readout layer 3 (60R), the recording layer 60W, the intermediate layer 60Im, the auxiliary recording layer 60Ws, the protective layer 5 and the overcoat layer 6.

Figure 15:
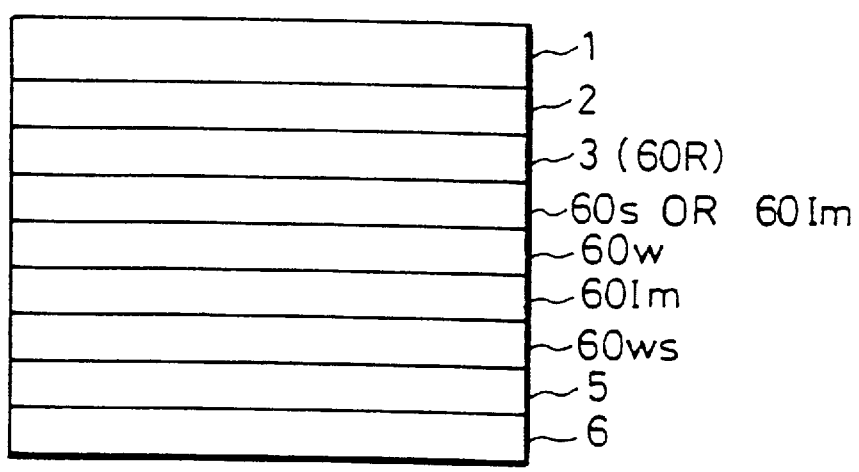
FIG. 15 is an explanatory drawing which shows another schematic arrangement of the magneto-optical recording medium.

The medium having the arrangement of a five magnetic layered structure, shown in FIG. 15 is composed of the light transmitting substrate 1, the transparent dielectric layer 2, the readout layer 3 (60R), the switching layer 60S or the intermediate layer 60Im, the recording layer 60W, the intermediate layer 60Im, the auxiliary recording layer 60Ws, the protective layer 5 and the overcoat layer 6.

Figure 16:
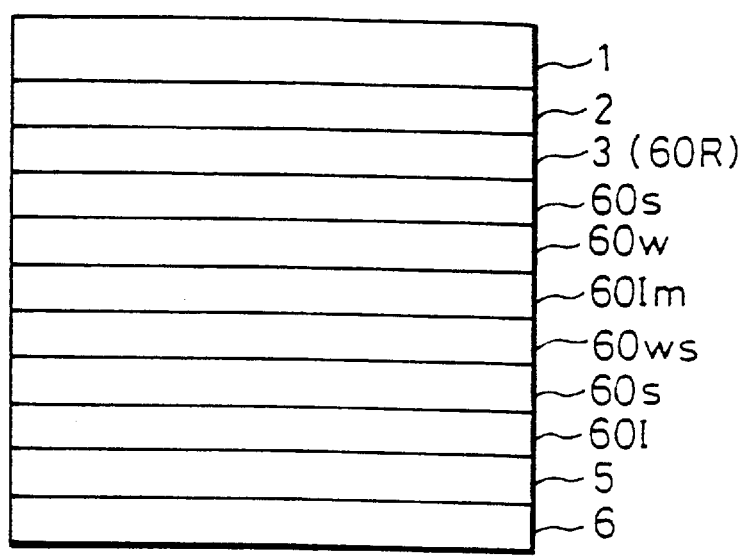
FIG. 16 is an explanatory drawing which shows another schematic arrangement of the magneto-optical recording medium.

The medium having the arrangement of a seven magnetic layered structure, shown in FIG. 16 is composed of the light transmitting substrate 1, the transparent dielectric layer 2, the readout layer 3 (60R), the switching layer 60S, the recording layer 60W, the intermediate layer 60Im, the auxiliary recording layer 60Ws, the switching layer 60S, the initializing layer 60I, the protective layer 5 and the overcoat layer 6.

The features of the described arrangements and the effects that can be achieved from the arrangements will be explained below.

In the arrangements shown in FIGS. 10 through 12, the intermediate layer 60Im or the switching layer 60S are formed between the readout layer 3 and the recording layer 4 of the arrangement shown in FIG. 1. Since this arrangement can decrease the intensity of the external recording magnetic field required for recording information, an overwriting by the magnetic field modulation is enabled, or the reproducing operation by high resolution can be stabilizing or performed desirably.

In addition to the reproducing operation by high resolution, the arrangements shown in FIGS. 13 through 16 enable an overwriting operation by the light intensity modulation.

In any of the described arrangements, when the present invention, which is featured by that the composition of the readout layer on the interface between itself and another magnetic layer does not change and that the density of the light rare earth metal such as Nd on the light incidence side is made high, is applied to a magneto-optical recording medium, the reduction in the required intensity of the external magnetic field, the stabilization in the reproduction with high resolution, and the overwriting function by light intensity modulation can be ensured, and an improved reproducing signal quality can be achieved.

The arrangement of the medium wherein a reproducing light is incident from the opposite side of the substrate will be explained.

Figure 17:
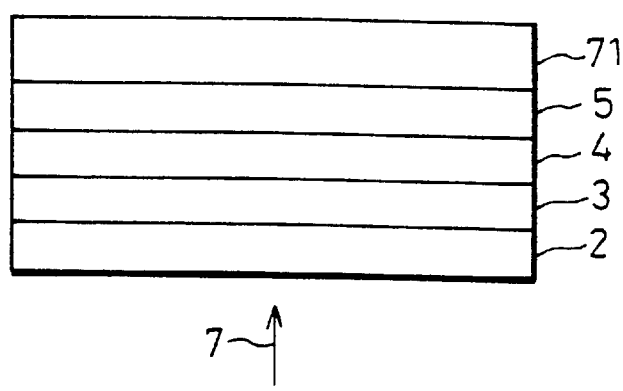
FIG. 17 is an explanatory drawing which shows another schematic arrangement of the magneto-optical recording medium.

The present embodiment discussed the arrangements of the medium (FIGS. 1, 10 through 16) in the case where a reproducing laser beam is projected from the light transmitting substrate 1. For example, in the case where a non-light transmitting substrate 71 is used instead of the light transmitting substrate 1, as shown in FIG. 17, the reproducing laser beam 7 is possibly projected to the recording medium from the opposite side of the substrate 71. In this case, as shown in FIG. 1, for example, the mediums is arranged so as to include the transparent dielectric layer 2, the readout layer 3, the recording layer 4, the protective layer 5 and the substrate 71 which are laminated in this order from the light incidence side. It is clear from the main point of the present invention that the density of light rare earth metal on the light incidence side is set high and that the density of light rare earth metal on the recording layer side is set low.

The same can be set in another arrangements shown in FIGS. 10 through 16. Moreover, in order to protect the transparent dielectric layer 2, a protective resin layer with excellent light transmitting properties (film thickness: several $\mu$m to several hundred $\mu$m), for example, may be provided on the transparent dielectric layer 2, namely, on the light incidence side.

The arrangement of the recording medium explained referring to FIG. 1 and FIGS. 10 through 16 is generally called as a single-sided type. An ultraviolet ray hardening type resin composed of a polymeric resin is applied to the protective layer 5 and an ultraviolet ray is projected thereto so as to form the overcoat layer 6.

Figure 18:
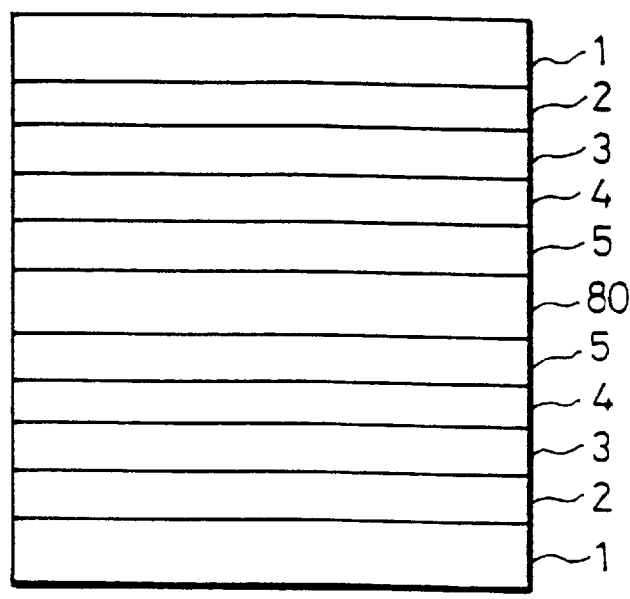
FIG. 18 is an explanatory drawing which shows another schematic arrangement of the magneto-optical recording medium.

Besides the above type, there is another one called as a both-sided type in which two substrates are laminated with their recording medium thin films faces inward. FIG. 18 shows the type of lamination in the case of the magneto-optical recording medium in FIG. 1. The substrates 1 on which the recording medium thin films are formed are laminated by using an adhesive member 80. As the adhesive member 80, an anaerobic-thermosetting ultraviolet ray hardening adhesive, for example, composed of polyurethane acrylate is suitably used. Here, the both-sided type is not limited to this, so in the state shown in FIG. 1, the overcoat layers 6 may be laminated by the adhesive member 80. As the adhesive member 80 in this case, beside the above-mentioned adhesive, both-side tape may be used.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A magneto-optical recording medium, comprising:
    a light incidence side comprising a light transmitting substrate having disposed thereon magnetic layers to form a film, the magnetic layers comprising:
    (a) a readout layer disposed adjacent one side-of the light transmitting substrate, wherein the readout layer comprises rare earth—transition metal alloy containing light rare earth metal and wherein in-plane magnetization of the readout layer appears at room temperature and a transition occurs from in-plane magnetization to perpendicular magnetization when temperature rises, and
    (b) a recording layer for storing information disposed above the readout layer;
    wherein density of the light rare earth metal in the readout layer decreases in film thickness direction from the light incidence side to the recording layer side.

2. The magneto-optical recording medium as defined in claim 1, wherein the light rare earth metal is chosen from at least one of the Nd, Pr or Sm.

3. The magneto-optical recording medium as defined in claim 2, wherein the rare earth—transition metal alloy is made of GdFeCo.

4. The magneto-optical recording medium as defined in claim 3, 0wherein when a composition of said readout layer is $Gd_X LR_Z(Fe_{1-Y}Co_Y)_{1-X-Y}$ where the light rare earth metal is represented by LR:
    the density X+Z is in a range of from 0.20 to 0.30,
    the density Z is in a range of 0<Z<0.20.

5. The magneto-optical recording medium as defined in claim 4, wherein the density Z of the light rare earth metal is set so that a density Zr on the side of the readout layer facing the recording layer is in a range of $0<Zr\leq0.10$ and a density Zi on the side of the readout layer facing the light incidence side is in a range of $0.01<Zi\leq0.20$.

6. The magneto-optical recording medium as defined in claim 4, wherein the Gd density X at a surface of the readout layer on the recording layer is in a range of from about 0.20 to 0.30.

7. The magneto-optical recording medium as defined in claim 4, wherein the Co density Y is in a range of $0.1 \leq Y < 0.40$.

8. The magneto-optical recording medium as defined in claim 2, wherein the rare earth—transition metal alloy is composed of GdFe.

9. The magneto-optical recording medium as defined in claim 2, wherein the rare earth—transition metal alloy is composed of GdCo.

10. The magneto-optical recording medium as defined in claim 2, wherein the rare earth—transition metal alloy is composed of TbFeCo.

11. The magneto-optical recording medium as defined in claim 2, wherein the rare earth—transition metal alloy is made of DyFeCo.

12. The magneto-optical recording medium as defined in claim 2, wherein the rare earth—transition metal alloy is made of HoFeCo.

13. The magneto-optical recording medium as defined in claim 1, wherein said recording layer is made of DyFeCo having a Curie temperature of from about 200° C. to about 250° C.

14. The magneto-optical recording medium as defined in claim 1, further comprising:
   (i) a transparent dielectric layer disposed between the substrate and the readout layer,
   (ii) a Protective layer disposed above the recording layers, the dielectric layer further comprises a protective layer and
   (iii) an overcoat layer disposed above the protective layer.

15. A magneto-optical recording medium, comprising:
   a light incidence side comprising a light-transmitting substrate having disposed thereon
   magnetic layers to form a film, the magnetic layers comprising:
      (a) a readout layer disposed adjacent one side of the light transmitting substrate, wherein the readout layer comprises rare earth—transition metal alloy and at least one element of the platinum group, wherein in-plane magnetization appears at room temperature and a transition occurs from in-plane magnetization to perpendicular magnetization when temperature rises, and a recording layer for storing information disposed above the readout layer;
   wherein the density of the element of the platinum group in the readout layer decreases in film thickness direction from the light incidence side to the recording layer side.

16. The magneto-optical recording medium as defined in claim 15, wherein the element of the platinum group is chosen from at least one of Pd and Pt.

17. A magneto-optical recording medium comprising:
   (a) a non-light transmitting substrate;
   (b) a protective layer disposed on the non-light transmitting substrate;
   (c) magnetic layers disposed above the protective layer to form a film, wherein the magnetic layers comprise:
      i) a recording layer disposed adjacent of the non-light transmitting substrate for storing information; and
      ii) a readout layer disposed above the recording layer, wherein the readout layer comprises a rare earth-transition metal alloy containing light rare earth metal; and
   wherein in-plane magnetization of the readout layer appears at room temperature and a transition occurs from in-plane magnetization to perpendicular magnetization when temperature rises, and
   (d) a transparent dielectric layer comprising the light incidence side disposed above the magnetic layers;
   wherein density of the light rare earth metal in the readout layer decreases in film thickness direction from the light incidence side to the recording layer side.

18. A magneto-optical recording medium as defined in claim 1, further comprising:
   a second light incidence side comprising a second light transmitting substrate having disposed thereon magnetic layers to form a film, the magnetic layers comprising:
      (a) a readout layer disposed adjacent one side of the light transmitting substrate, wherein the readout layer comprises a rare earth—transition metal alloy containing light rare earth metal and wherein in-plane magnetization of the readout layer appears at room temperature and a transition occurs from in-plane magnetization to perpendicular magnetization when temperature rises, and p2 (b) a recording layer for storing information disposed above the readout layer
   wherein density of the light rare earth metal in the readout layer decreases in film thickness direction from the second light incidence side to the recording layer side and wherein the first and second light transmitting substrates are joined so that the recording layers on the first and second light transmitting substrates face each other.

19. A magneto-optical recording medium comprising:
   a light incidence side comprising a light transmitting substrate having disposed thereon magnetic layers to form a film, the magnetic layers comprising:
      (a) a readout layer disposed adjacent one side of the light transmitting substrate, wherein the readout layer comprises rare earth—transition metal alloy containing light rare earth metal and wherein in-plane magnetization of the readout layer appears at room temperature and a transition occurs from in-plane magnetization to perpendicular magnetization when temperature rises, and
      (b) a recording layer for storing information disposed above the readout layer,
   wherein density of he light rare earth metal in the readout layer decreases in film thickness direction from the light incidence side to the recording layer side, and density of the transition metal in the readout layer in film thickness direction is substantially constant.

20. A magneto-optical recording medium comprising:
   a light incidence side comprising a light-transmitting substrate having disposed thereon
   magnetic layers to form a film, the magnetic layers comprising:
      (a) a readout layer disposed adjacent of the substrate wherein the readout layer comprises rare earth-transition metal alloy and at least one element of the platinum group, wherein in-plane magnetization appears at room temperature and a transition occurs from in-plane magnetization to perpendicular magnetization when temperature rises, and
      (b) a recording layer disposed above the readout layer for storing information, wherein the density of the element of the platinum group in the readout layer decreases in film thickness direction from the light incidence side to the recording layer side, and density of the transition metal in the readout layer in film thickness direction is substantially constant.

* * * * *

UNITED STATES PATENT AND TRADEMARK OFFICE

CERTIFICATE OF CORRECTION

PATENT NO.: 5,824,426

DATED: October 20, 1998

INVENTOR(S): Iketani et al.

It is certified that error appears in the above-identified patent and that said Letters Patent is hereby corrected as shown below:

On the Cover page, column 1, at "[73]" please delete "Sharp Kabushiki kaisga, Osaka, Japan" and insert --Sharp Kabushiki Kaisha, Osaka, Japan--.

Signed and Sealed this

Twenty-third Day of March, 1999

Attest:

Q. TODD DICKINSON

Attesting Officer

Acting Commissioner of Patents and Trademarks